United States Patent
Kim

(10) Patent No.: US 8,571,836 B2
(45) Date of Patent: *Oct. 29, 2013

(54) PROCESS FOR DESIGNING RUGGED PATTERN ON GOLF BALL SURFACE

(75) Inventor: Hyoungchol Kim, Kobe (JP)

(73) Assignee: SRI Sports Limited, Kobe (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/541,315

(22) Filed: Jul. 3, 2012

(65) Prior Publication Data

US 2012/0277033 A1 Nov. 1, 2012

Related U.S. Application Data

(63) Continuation of application No. 12/553,702, filed on Sep. 3, 2009, now Pat. No. 8,301,418.

(30) Foreign Application Priority Data

Oct. 8, 2008 (JP) .................................. 2008-261266

(51) Int. Cl.
*G06F 17/50* (2006.01)
*A63B 37/00* (2006.01)
*A63B 37/12* (2006.01)

(52) U.S. Cl.
USPC ................................ 703/1; 473/351; 473/378

(58) Field of Classification Search
USPC .......... 703/1, 2; 473/351, 378, 379, 380, 381, 473/382
See application file for complete search history.

(56) References Cited

U.S. PATENT DOCUMENTS

| 4,729,861 | A | 3/1988 | Lynch et al. | |
| 4,744,564 | A | 5/1988 | Yamada | |
| 5,292,132 | A | 3/1994 | Oka | |
| 6,643,628 | B1 | 11/2003 | Jackson et al. | |
| 7,601,080 | B2 * | 10/2009 | Olson et al. | 473/384 |
| 2003/0096665 | A1* | 5/2003 | Sullivan | 473/383 |
| 2004/0219996 | A1* | 11/2004 | Sullivan | 473/378 |

FOREIGN PATENT DOCUMENTS

| GB | 1415413 A | 11/1975 |
| JP | 50-8630 A | 1/1975 |
| JP | 61-284264 A | 12/1986 |
| JP | 4-347177 A | 12/1992 |

* cited by examiner

*Primary Examiner* — Kamini S Shah
*Assistant Examiner* — Andre Pierre Louis
(74) *Attorney, Agent, or Firm* — Birch, Stewart, Kolasch & Birch, LLP

(57) ABSTRACT

A process for designing the rugged pattern includes the steps of: assuming a plurality of states; assuming a large number of cells on a spherical surface; assigning any one of the plurality of states to each cell; assigning, as an attribute, any one of INSIDE, OUTSIDE and BOUNDARY to the each cell based on the state of the each cell and states of a plurality of cells located adjacent to the each cell; assuming craters based on the attributes of the large number of cells; and updating the attribute of the each cell so as to enlarge the areas of the craters, based on the attribute of said each cell and the attributes of the plurality of cells located adjacent to the each cell.

17 Claims, 52 Drawing Sheets

20  16a(16)  18

PROCESS FOR DESIGNING RUGGED PATTERN ON GOLF BALL SURFACE

CROSS REFERENCE

The present application is a 37 C.F.R. §1.53(b) continuation of, and claims priority to U.S. application Ser. No. 12/553,702, filed on Sep. 3, 2009 now U.S. Pat. No. 8,301, 418. Priority is also claimed to Japanese Application No. 2008-261266 filed on Oct. 8, 2008. The entire contents of each of these applications is hereby incorporated by reference.

BACKGROUND OF THE INVENTION

1. Field of the Invention

The present invention relates to golf balls. Specifically, the present invention relates to processes for designing a rugged pattern on a golf ball surface.

2. Description of the Related Art

Golf balls have a large number of dimples on the surface thereof. The dimples disturb the air flow around the golf ball during flight to cause turbulent flow separation. By causing the turbulent flow separation, separation points of the air from the golf ball shift backwards leading to a reduction of drag. The turbulent flow separation promotes the displacement between the separation point on the upper side and the separation point on the lower side of the golf ball, which results from the backspin, thereby enhancing the lift force that acts upon the golf ball. The reduction of drag and the enhancement of lift force are referred to as a "dimple effect".

In a golf ball, the ratio of the sum of the areas of all dimples to the area of the phantom sphere is referred to as an occupation ratio. A golf ball with a high occupation ratio has a great dimple effect. JP-H4-347177 discloses a golf ball having an increased occupation ratio.

The United States Golf Association (USGA) has established the rules about symmetry of golf balls. According to the rules, the trajectory during PH (poles horizontal) rotation and the trajectory during POP (pole over pole) rotation are compared with each other. A golf ball having a large difference between these two trajectories, that is, inferior aerodynamic symmetry, does not conform to the rules. A golf ball with inferior aerodynamic symmetry has a short flight distance because the aerodynamic characteristic of the golf ball for PH rotation or for POP rotation is inferior. The rotation axis for PH rotation extends through the poles of the golf ball, and the rotation axis for POP rotation is orthogonal to the rotation axis for PH rotation.

The dimples can be arranged by using a regular polyhedron that is inscribed in the phantom sphere of a golf ball. In this arrangement method, the surface of the phantom sphere is divided into a plurality of units by division lines obtained by projecting the sides of the polyhedron on the spherical surface. The dimple pattern of one unit is developed all over the phantom sphere. According to this dimple pattern, the aerodynamic characteristic in the case where a line passing through a vertex of the regular polyhedron is a rotation axis is different from that in the case where a line passing through the center of a surface of the regular polyhedron is a rotation axis. Such a golf ball has inferior aerodynamic symmetry.

JP-S50-8630 discloses a golf ball having an improved dimple pattern. The surface of the golf ball is divided by an icosahedron that is inscribed in the phantom sphere thereof. Based on this division, dimples are arranged on the surface of the golf ball. According to this dimple pattern, the number of great circles that do not intersect any dimples is 1. This great circle agrees with the equator of the golf ball. The region near the equator is a unique region.

Generally, a golf ball is formed by a mold having upper and lower mold halves. The mold has a parting line. A golf ball obtained by this mold has a seam at a position along the parting line. Through this forming, spew occurs along the seam. The spew is removed by means of cutting. By cutting the spew, the dimples near the seam are deformed. In addition, the dimples near the seam tend to be orderly arranged. The seam is located along the equator of the golf ball. The region near the equator is a unique region.

A mold having a corrugated parting line has been used. A golf ball obtained by this mold has dimples on the equator thereof. The dimples on the equator contribute to eliminating the uniqueness of the region near the equator. However, the uniqueness is not sufficiently eliminated. This golf ball has insufficient aerodynamic symmetry.

JP-S61-284264 discloses a golf ball in which the dimples near the seam are greater in volume than the dimples near the poles. This volume difference contributes to eliminating the uniqueness of the region near the equator.

A golf ball disclosed in JP61-284264 eliminates, by the volume difference of dimples, the disadvantage caused by the dimple pattern. The disadvantage is eliminated not by modification of the dimple pattern. In the golf ball, the potential of the dimple pattern is sacrificed. The flight distance of the golf ball is insufficient.

Research has been conducted to determine the causes of the uniqueness of the region near the equator and the consequent insufficient symmetry. However, the causes have not been clarified yet, and a general theory for the improvements has not been established.

An objective of the present invention is to provide a golf ball having a high occupation ratio, excellent flight performance and excellent aerodynamic symmetry.

SUMMARY OF THE INVENTION

A process for designing a rugged pattern according to the present invention comprises the steps of:

assuming a plurality of states;

assuming a large number of cells on a spherical surface;

assigning any one of the plurality of states to each cell;

assigning, as an attribute, any one of INSIDE, OUTSIDE and BOUNDARY to said each cell based on the state of said each cell and states of a plurality of cells located adjacent to said each cell;

assuming craters based on the attributes of the large number of cells; and updating the attribute of said each cell so as to enlarge the areas of the craters, based on the attribute of said each cell and the attributes of the plurality of cells located adjacent to said each cell.

Preferably, the crater assuming step includes the steps of:

assigning a recess to cells whose attributes are INSIDE or BOUNDARY; and assigning a land to cells whose attributes are OUTSIDE.

Each of the craters is assumed by a set of recesses.

The crater assuming step may include the steps of:

assigning a recess to cells whose attributes are INSIDE; and assigning a land to cells whose attributes are OUTSIDE or BOUNDARY.

Each of the craters is assumed by a set of recesses.

Preferably, the designing process further comprises the step of calculating the areas of the craters and determining whether or not to perform the update of attribute. Preferably, in the designing process, the update of attribute is repeated a plurality of times. Preferably, the attributes of cells whose attributes are OUTSIDE and that are adjacent to cells whose attributes are BOUNDARY are changed to BOUNDARY at the step of updating the attribute of said each cell.

Preferably, the assignment of a state to said each cell is performed by the steps of:
deciding an initial state of said each cell;
determining whether or not to change the state of said each cell based on the states of the plurality of cells located adjacent to said each cell; and
updating the state of said each cell based on this determination.

Preferably, the initial state is decided in a random manner. Preferably, after the determination as to whether or not to change the state of said each cell and the update of the state of said each cell are repeated 3 times or more, an attribute is assigned to said each cell.

Preferably, the determination as to whether or not to change the state of said each cell and the update of the state of said each cell are performed by a Cellular Automaton method. Preferably, this determination and this update are performed by a reaction-diffusion model of the Cellular Automaton method. Preferably, the number of the cells is 5000 or greater and 300000 or less.

Preferably, whether or not to change the state is determined based on a value E calculated by the following mathematical formula (1).

$$E = W_1 * N_{R1} + W_2 * N_{R1-R2} \quad (1)$$

In the mathematical formula (1), $W_1$ denotes a first concentration, $N_{R1}$ denotes the number of cells that are included in a first circle, not located at the center of the first circle, and in a specific state, $W_2$ denotes a second concentration, $N_{R1-R2}$ denotes the number of cells that are included in a second circle, not included in the first circle, and in a specific state, the first concentration is positive, the second concentration is negative, the first circle has the center at said each cell and an index radius of $R_1$, the second circle has a center at said each cell and an index radius of $R_2$, and the radius $R_2$ is greater than the radius $R_1$.

Preferably, the initial state of said each cell is differentiated or undifferentiated. When the value E calculated by the following mathematical formula (1) is positive, the state of said each cell is maintained if the state of said each cell is differentiated, and is changed to be differentiated if the state of said each cell is undifferentiated. When the value E is zero, the state of said each cell is maintained. When the value E is negative, the state of said each cell is changed to be undifferentiated if the state of said each cell is differentiated, and is maintained if the state of said each cell is undifferentiated.

$$E = W_1 * N_{R1} + W_2 * N_{R1-R2} \quad (1)$$

In the mathematical formula (1), $W_1$ denotes a first concentration, $N_{R1}$ denotes the number of differentiated cells that are included in a first circle and not located at the center of the first circle, $W_2$ denotes a second concentration, $N_{R1-R2}$ denotes the number of differentiated cells that are included in a second circle and not included in the first circle, the first concentration is positive, the second concentration is negative, the first circle has the center at said each cell and an index radius of $R_1$, the second circle has a center at said each cell and an index radius of $R_2$, and the radius $R_2$ is greater than the radius $R_1$.

Preferably, the first concentration $W_1$ is 0.80 or greater and 1.20 or less. Preferably, the second concentration $W_2$ is −0.70 or greater and −0.50 or less. Preferably, the index radius $R_1$ is 2.20 or greater and 5.0 or less. Preferably, the index radius $R_2$ is 3.0 or greater and 10.0 or less.

A golf ball according to the present invention has a large number of craters on a surface thereof. A pattern of these craters is designed by the above process Preferably, the absolute value of a difference dR of the golf ball is 2.5 mm or less. The difference dR is obtained by the following steps (1) to (17):

(1) assuming a line connecting both poles of the golf ball as a first rotation axis;

(2) assuming a great circle which exists on a surface of a phantom sphere of the golf ball and is orthogonal to the first rotation axis;

(3) assuming two small circles which exist on the surface of the phantom sphere of the golf ball, which are orthogonal to the first rotation axis, and of which the absolute value of a central angle with the great circle is 30°;

(4) defining a region, of the surface of the golf ball, which is obtained by dividing the phantom sphere at the two small circles and which is sandwiched between the two small circles;

(5) determining 30240 points, on the region, arranged at intervals of a central angle of 3° in a direction of the first rotation axis and at intervals of a central angle of 0.25° in a direction of rotation about the first rotation axis;

(6) calculating a length L1 of a perpendicular line which extends from each point to the first rotation axis;

(7) calculating a total length L2 by summing 21 lengths L1 calculated based on 21 perpendicular lines arranged in the direction of the first rotation axis;

(8) determining a maximum value and a minimum value among 1440 total lengths L2 calculated along the direction of rotation about the first rotation axis, and calculating a fluctuation range Rh by subtracting the minimum value from the maximum value;

(9) assuming a second rotation axis orthogonal to the first rotation axis assumed at the step (1);

(10) assuming a great circle which exists on the surface of the phantom sphere of the golf ball and is orthogonal to the second rotation axis;

(11) assuming two small circles which exist on the surface of the phantom sphere of the golf ball, which are orthogonal to the second rotation axis, and of which the absolute value of a central angle with the great circle is 30°;

(12) defining a region, of the surface of the golf ball, which is obtained by dividing the phantom sphere at the two small circles and which is sandwiched between the two small circles;

(13) determining 30240 points, on the region, arranged at intervals of a central angle of 3° in a direction of the second rotation axis and at intervals of a central angle of 0.25° in a direction of rotation about the second rotation axis;

(14) calculating a length L1 of a perpendicular line which extends from each point to the second rotation axis;

(15) calculating a total length L2 by summing 21 lengths L1 calculated based on 21 perpendicular lines arranged in the direction of the second rotation axis;

(16) determining a maximum value and a minimum value among 1440 total lengths L2 calculated along the direction of rotation about the second rotation axis, and calculating a fluctuation range Ro by subtracting the minimum value from the maximum value; and

(17) calculating the difference dR between the fluctuation ranges Rh and Ro.

Preferably, the absolute value of the difference dR is 1.0 mm or less. Preferably, each of the fluctuation range Rh and the fluctuation range Ro is 3.0 mm or less. Preferably, the ratio of the total area of the craters to the surface area of the phantom sphere of the golf ball is 65% or greater.

On the surface of the golf ball according to the present invention, a large number of craters are formed. These craters prompt turbulent flow separation. These craters contribute to the flight performance of the golf ball. Because these craters are arranged in a random manner, the pattern does not have directional properties. The golf ball 2 has excellent aerodynamic symmetry. The occupation ratio of these craters is great.

DESCRIPTION OF THE PREFERRED EMBODIMENTS

The following will describe in detail the present invention based on preferred embodiments with reference to the accompanying drawings.

Figure 1:
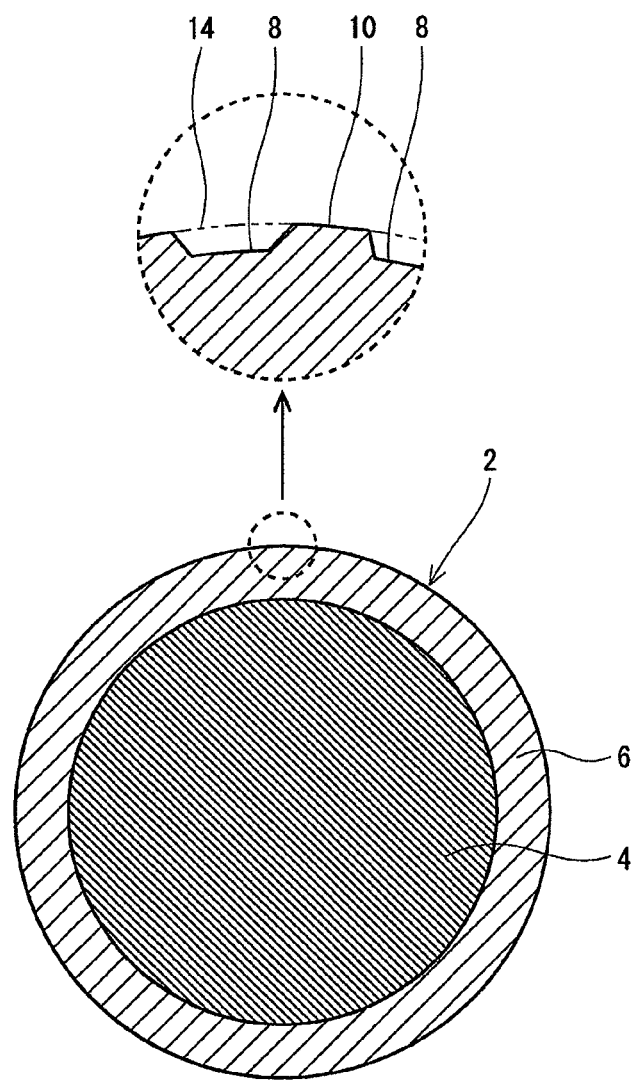
FIG. 1 is a schematic cross-sectional view of a golf ball according to one embodiment of the present invention.

Golf ball 2 shown in FIG. 1 includes a spherical core 4 and a cover 6. On the surface of the cover 6, a large number of craters 8 are formed. Of the surface of the golf ball 2, a part other than the craters 8 is a land 10. The golf ball 2 includes a paint layer and a mark layer on the external side of the cover 6 although these layers are not shown in the drawing. A mid layer may be provided between the core 4 and the cover 6.

The diameter of the golf ball 2 is 40 mm or greater and 45 mm or less. From the standpoint of conformity to the rules established by the United States Golf Association (USGA), the diameter is more preferably 42.67 mm or greater. In light of suppression of air resistance, the diameter is more preferably 44 mm or less and particularly preferably 42.80 mm or less. The weight of the golf ball 2 is 40 g or greater and 50 g or less. In light of attainment of great inertia, the weight is preferably 44 g or greater and more preferably 45.00 g or greater. From the standpoint of conformity to the rules established by the USGA, the weight is preferably 45.93 g or less.

The core 4 is formed by crosslinking a rubber composition. Examples of base rubbers for use in the rubber composition include polybutadienes, polyisoprenes, styrene-butadiene copolymers, ethylene-propylene-diene copolymers and natural rubbers. Two or more types of these rubbers may be used in combination. In light of resilience performance, polybutadienes are preferred, and in particular, high-cis polybutadienes are preferred.

In order to crosslink the core 4, a co-crosslinking agent can be used. Examples of preferable co-crosslinking agents in light of resilience performance include zinc acrylate, magnesium acrylate, zinc methacrylate and magnesium methacrylate. Preferably, the rubber composition includes an organic peroxide together with a co-crosslinking agent. Examples of suitable organic peroxides include dicumyl peroxide, 1,1-bis(t-butylperoxy)-3,3,5-trimethylcyclohexane, 2,5-dimethyl-2,5-di(t-butylperoxy)hexane and di-t-butyl peroxide.

According to need, various additives such as sulfur, a sulfur compound, a filler, an anti-aging agent, a coloring agent, a plasticizer, a dispersant and the like are included in the rubber composition for the core 4 at an adequate amount. Crosslinked rubber powder or synthetic resin powder may be also included in the rubber composition.

The diameter of the core 4 is 30 mm or greater, and particularly 38 mm or greater. The diameter of the core 4 is 42 mm or less, and particularly 41.5 mm or less. The core 4 may be formed with two or more layers.

A suitable polymer for the cover 6 is an ionomer resin. Examples of preferable ionomer resins include binary copolymers formed with an $\alpha$-olefin and an $\alpha,\beta$-unsaturated carboxylic acid having 3 to 8 carbon atoms. Examples of other preferable ionomer resins include ternary copolymers formed with: an $\alpha$-olefin; an $\alpha,\beta$-unsaturated carboxylic acid having 3 to 8 carbon atoms; and an $\alpha,\beta$-unsaturated carboxylate ester having 2 to 22 carbon atoms. For the binary copolymer and ternary copolymer, preferable $\alpha$-olefins are ethylene and propylene, while preferable $\alpha,\beta$-unsaturated carboxylic acids are acrylic acid and methacrylic acid. In the binary copolymer and ternary copolymer, some of the carboxyl groups are neutralized with metal ions. Examples of metal ions for use in neutralization include sodium ion, potassium ion, lithium ion, zinc ion, calcium ion, magnesium ion, aluminum ion and neodymium ion.

Other polymers may be used instead of or together with an ionomer resin. Examples of the other polymers include thermoplastic polyurethane elastomers, thermoplastic styrene elastomers, thermoplastic polyamide elastomers, thermoplastic polyester elastomers and thermoplastic polyolefin elastomers.

According to need, a coloring agent such as titanium dioxide, a filler such as barium sulfate, a dispersant, an antioxidant, an ultraviolet absorber, a light stabilizer, a fluorescent material, a fluorescent brightener and the like are included in the cover 6 at an adequate amount. For the purpose of adjusting specific gravity, powder of a metal with a high specific gravity such as tungsten, molybdenum and the like may be included in the cover 6.

The thickness of the cover 6 is 0.3 mm or greater, and particularly 0.5 mm or greater. The thickness of the cover 6 is 2.5 mm or less and particularly 2.2 mm or less. The specific gravity of the cover 6 is 0.90 or greater and particularly 0.95 or greater. The specific gravity of the cover 6 is 1.10 or less and particularly 1.05 or less. The cover 6 may be formed with two or more layers.

Figure 2:
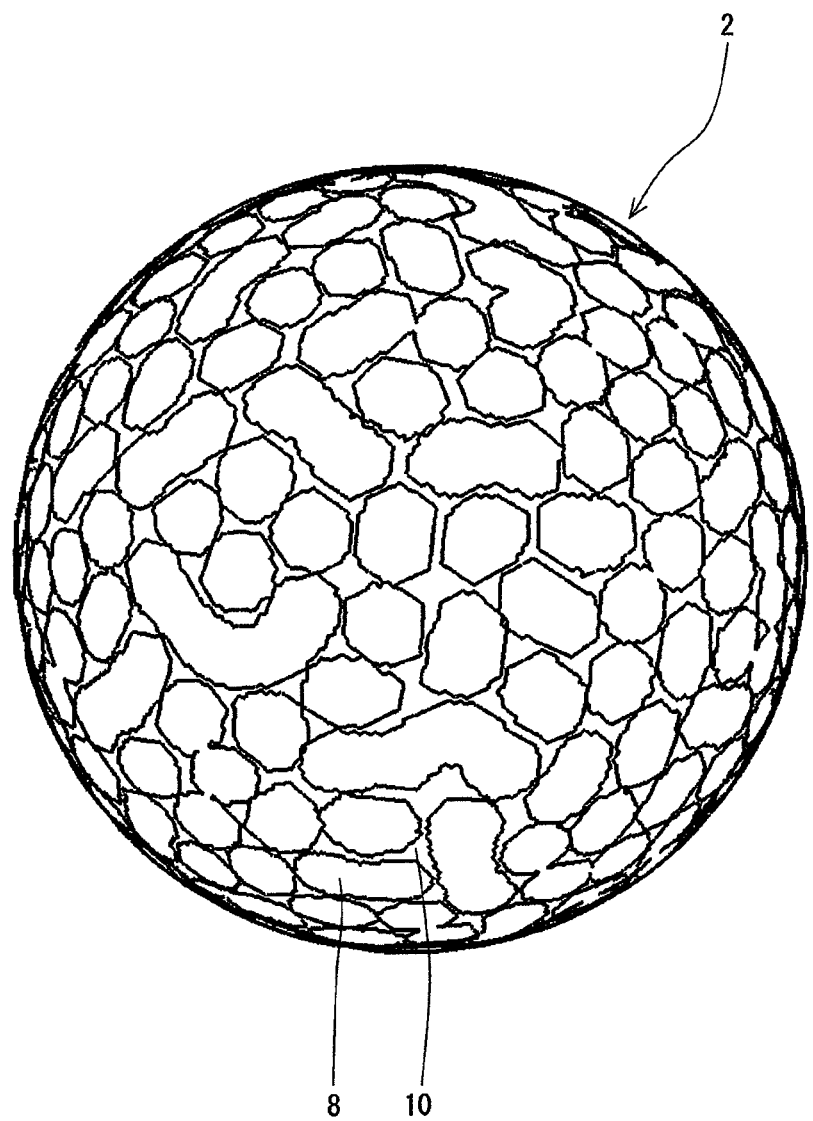
FIG. 2 is a an enlarged front view of the golf ball in FIG. 1.

FIG. 2 is an enlarged front view of the golf ball 2 in FIG. 1. As is clear from FIG. 2, a large number of the craters 8 are arranged in a random manner. By these craters 8 and the land 10, a rugged pattern is formed on the surface of the golf ball 2.

For designing the rugged pattern, a Cellular Automaton method is used. The Cellular Automaton method is widely used in the fields of computability theory, mathematics, theoretical biology and the like. A model of the Cellular Automaton method consists of a large number of cells and simple rules. By this model, natural phenomena such as life phenomena, crystal growth, turbulant flow and the like can be simulated. In this model, each cell has a state. This state can change to another state as a stage proceeds. The state of a cell at stage (t+1) is decided by the state of this cell and the states of a plurality of cells adjacent to this cell at stage (t). This decision is performed according to a rule. This rule is equally applied to all the cells.

For designing the rugged pattern, a reaction-diffusion model of the Cellular Automaton method is suitable. This model is used for simulating patterns on body surfaces of beasts, birds, fish, insects and the like. In this model, a plurality of states are assumed. The number of states is normally 2 or more and 8 or less. For each cell, an initial state is decided. As a stage proceeds, the state is updated according to a rule. There are cells whose states change by this update, while there are also cells whose states do not change by this update. The Cellular Automaton method is disclosed at Pages 25 to of "Cellular Automaton method, Self-organization of Complex Systems and Massively Parallel Processing" (written by Yasuyoshi Kato et al, published by Morikita Publishing Co., Ltd., in Japanese).

A designing process according to the present invention is characterized in that the state of a cell is updated under the influence of other cells adjacent to this cell. By this update, a rugged pattern in which a large number of craters 8 are arranged in a random manner is obtained. As long as this characteristic is maintained, any model can be used. The designing process according to the present invention is preferably executed using a computer and software in light of efficiency. Of course, the present invention is practicable even by hand calculation. The essence of the present invention is not in a computer and software. The following will describe in detail a designing process using a reaction-diffusion model of the Cellular Automaton method.

Figure 3:
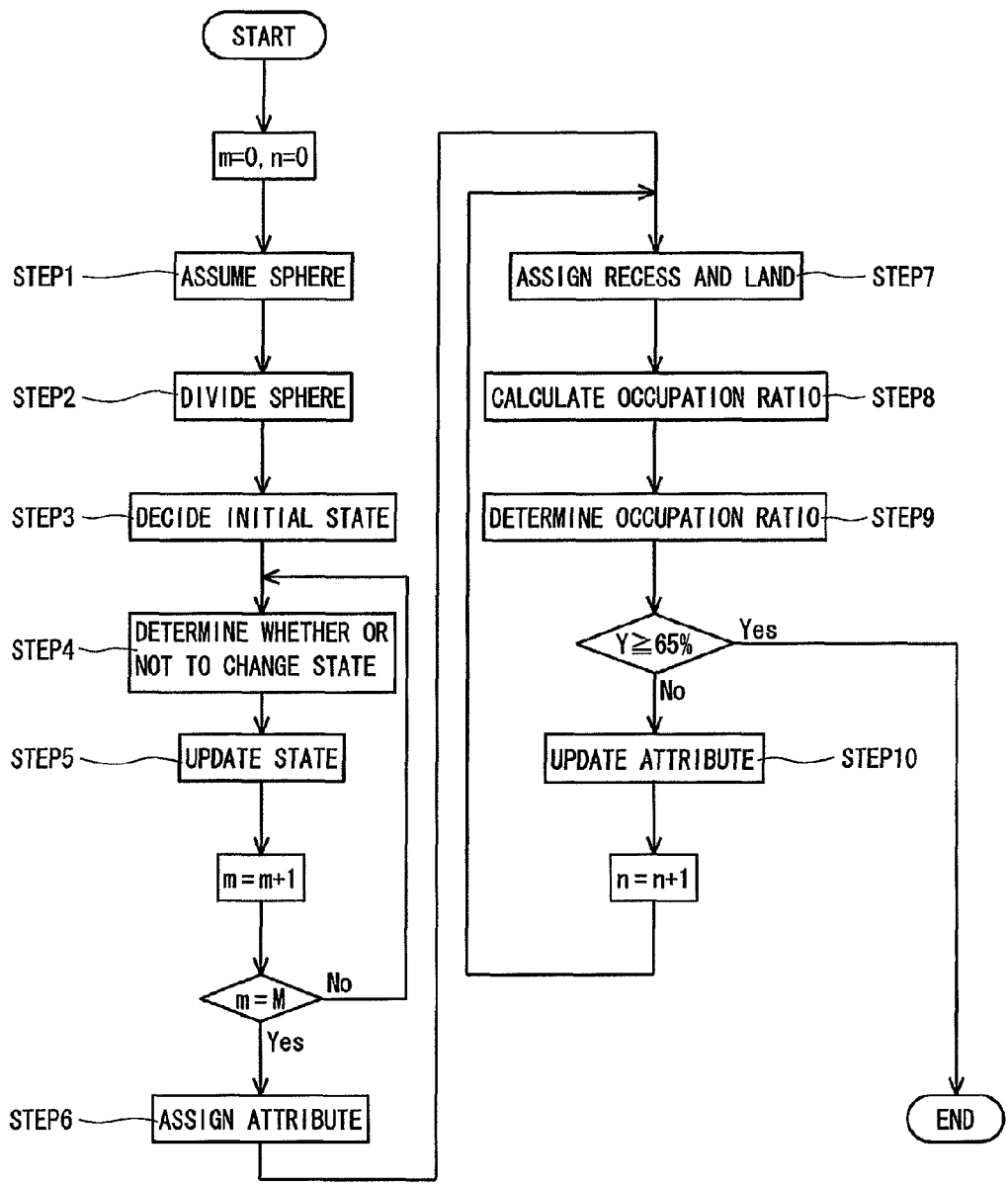
FIG. 3 is a flow chart of a designing process according to one embodiment of the present invention.
Figure 4:
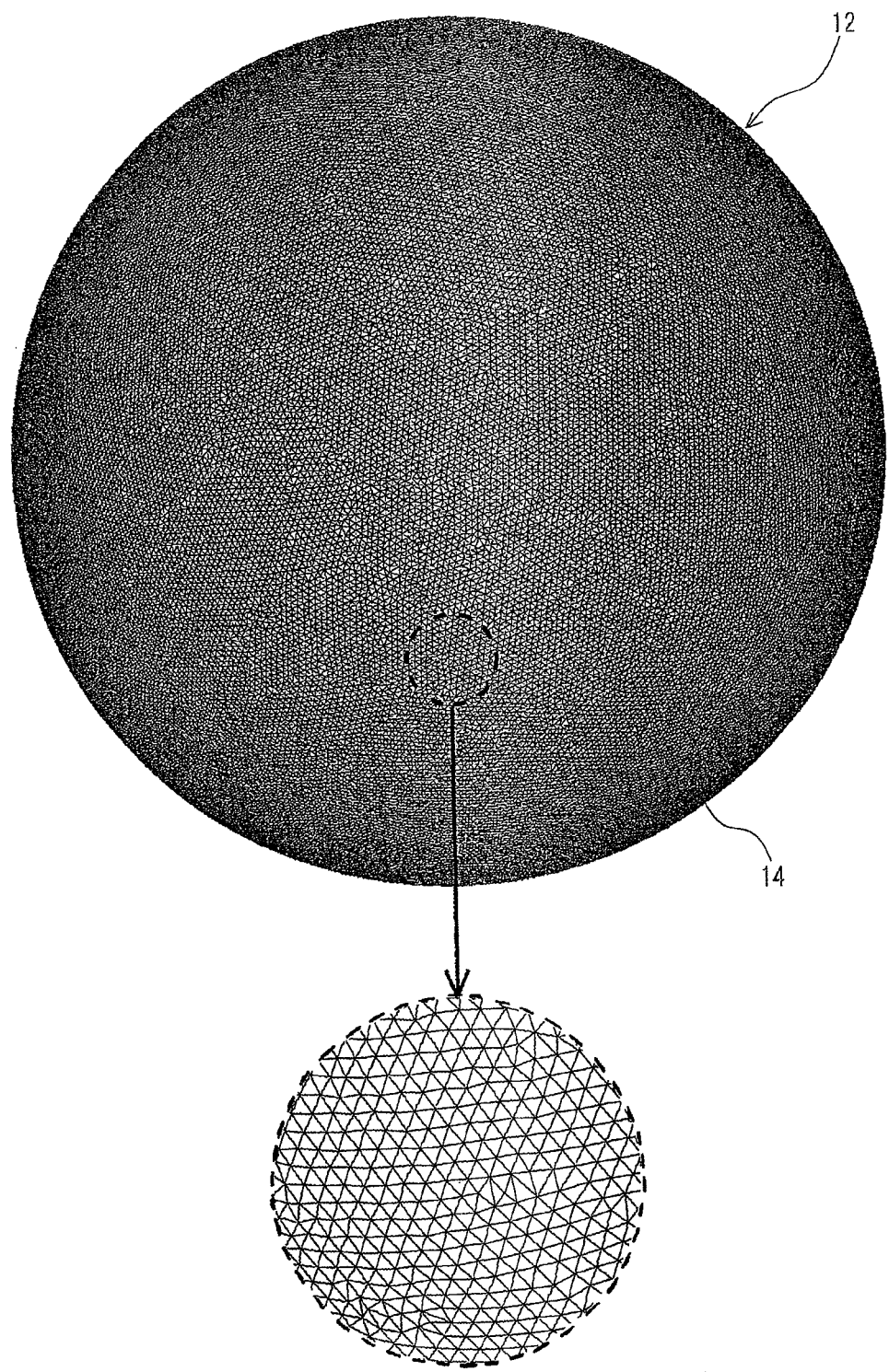
FIG. 4 is a front view of a mesh used in the designing process in FIG. 3.

FIG. 3 is a flow chart of a designing process according to one embodiment of the present invention. FIG. 4 is a front view of a mesh 12 used in the designing process in FIG. 3. For forming the mesh 12, a sphere 14 is assumed (STEP 1). The diameter of the phantom sphere 14 is the same as that of the golf ball 2. The surface of the phantom sphere 14 is divided into a large number of triangles (STEP 2). This division is performed based on an advancing front method. The advancing front method is disclosed at Pages 195 to 197 of "Graduate School of Information Science and Technology 3, Computational Dynamics" (edited by Kouichi ITO, published by Kodansha Ltd., in Japanese). The mesh 12 has 176528 triangles and 88266 vertexes. Each vertex is defined as a cell (or the center of a cell). The mesh 12 has 88266 cells. The phantom sphere 14 may be divided by other methods.

In the designing process, two states, a differentiated state and an undifferentiated state, are assumed. For each cell, either state (an initial state) is decided (STEP 3). The decision is preferably performed in a random manner. For the random decision, random numbers and a residue system are used. Because the number of states is 2, a residue system having a base of 2 is used. Specifically, a random number to 5 decimal places, which is equal to or greater than 0 and less than 1, is generated by a computer. The random number is multiplied by 100000, and the product is divided by 2. The remainder for the division is "1" or "0". Based on the remainder, the state of the cell is decided. For example, when the remainder is "1", the differentiated state is selected, and when the remainder is "0", the undifferentiated state is selected. For all the cells, this decision is performed. The mesh 12 after the decision is at stage 1.

Figure 5:
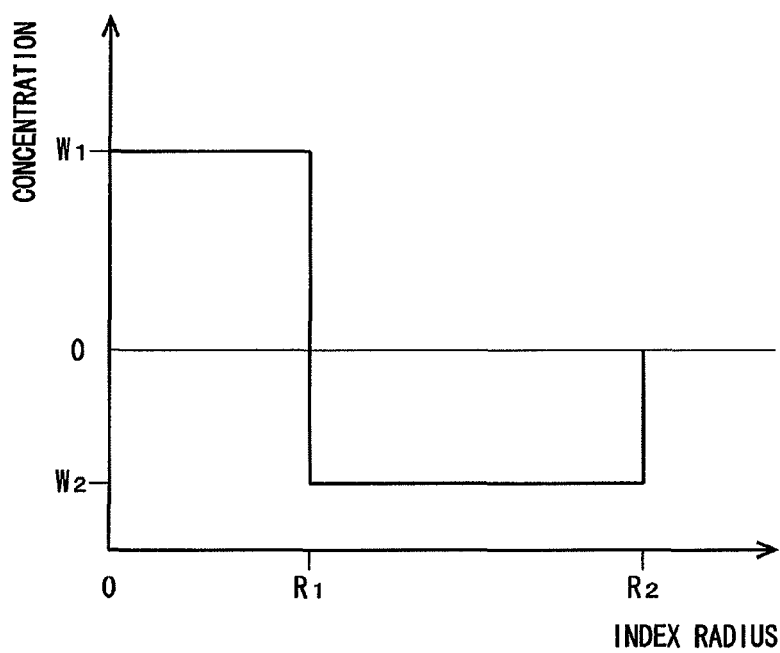
FIG. 5 is a graph for explaining a rule for the designing process in FIG. 3.

For each cell, whether or not to change the state is determined (STEP 4). This determination is performed according to a rule. FIG. 5 is a graph for explaining the rule. In the graph, the vertical axis indicates a concentration, and the horizontal axis indicates an index radius. The index radius is a value obtained by dividing a distance from the cell by a reference value. The reference value is the distance between the cell and a cell closest to the cell. A first concentration $W_1$ is positive, and a second concentration $W_2$ is negative. The absolute value of the first concentration $W_1$ is greater than the absolute value of the second concentration $W_2$. An index radius $R_2$ is greater than an index radius $R_1$. In the area where the index radius is greater than 0 and equal to or less than $R_1$, the concentration is $W_1$. In the area where the index radius is greater than $R_1$ and equal to or less than $R_2$, the concentration is $W_2$.

Figure 6:
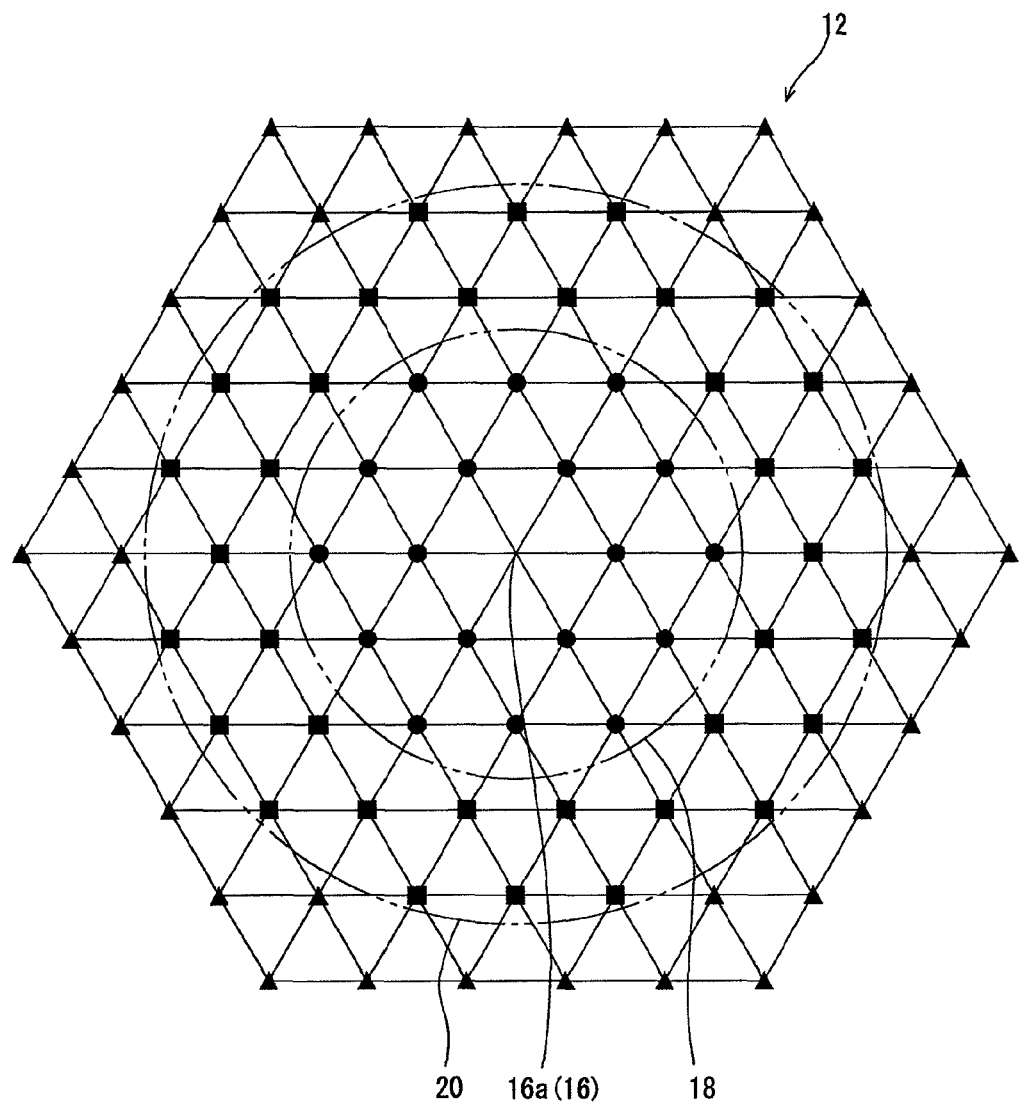
FIG. 6 is a partially enlarged view of the mesh in FIG. 4.

FIG. 6 is a partially enlarged view of the mesh 12 in FIG. 4. For convenience's sake, in FIG. 6, the mesh 12 is two-dimensionally drawn. At the center in FIG. 6, a cell 16a, which is an object for which the determination is performed, is shown. Further, in FIG. 6, a first circle 18 and a second circle 20 are shown. The first circle 18 has a center at the cell 16a and an index radius of $R_1$. The second circle 20 has a center at the cell 16a and an index radius of $R_2$. What is indicated by filled circles are cells included in the first circle 18 other than the cell 16a. What is indicated by filled squares are cells included in the second circle 20 and not included in the first circle 18. What is indicated by filled triangles are cells not included in the second circle 20.

In the designing process, the number $N_{R1}$ of cells that are included in the first circle 18, not located at the center of the first circle 18, and in a specific state is counted. In a preferred embodiment, the number of cells whose states are differentiated is counted to obtain the total number $N_{R1}$. Further, in the designing process, the number $N_{R1-R2}$ of cells that are included in the second circle 20, not included in the first circle 18, and in a specific state is counted. In a preferred embodiment, the number of cells whose states are differentiated is counted to obtain the total number $N_{R1-R2}$. The numbers $N_{R1}$ and $N_{R1-R2}$ are substituted into the following mathematical formula (1) to obtain a value E. Based on the value E, whether or not to change the state of the cell 16a is determined.

$$E = W_1 * N_{R1} + W_2 * N_{R1-R2} \quad (1)$$

Based on the determination, the state of the cell 16a is updated (STEP 5). In the update, the state of the cell 16a may change or may not change. In a preferred embodiment, when the value E is positive, the state of the cell 16a is maintained if the state of the cell 16a is differentiated, and the state of the cell 16a is changed to be differentiated if the state of the cell 16a is undifferentiated. When the value E is zero, the state of the cell 16a is maintained. When the value E is negative, the state of the cell 16a is changed to be undifferentiated if the state of the cell 16a is differentiated, and the state of the cell 16a is maintained if the state of the cell 16a is undifferentiated. The mesh 12 in which the update for the first time is completed for all the cells is at stage 2.

The following will describe a calculation example for the determination and the update.
Conditions
    First concentration $W_1$: 1.00
    Second concentration $W_2$: −0.60
    Number of cells that are included in the first circle 18 and whose states are differentiated (except for the cell 16a): 8
    Number of cells that are included in the second circle 20 and not included in the first circle 18 and whose states are differentiated: 13
Calculation Example $$E = 1.00 * 8 - 0.60 * 13$$
$$= 0.2$$

In this case, because the value E is positive, the state of the cell 16a is maintained if the state of the cell 16a is differentiated, and the state of the cell 16a is changed to be differentiated if the state of the cell 16a is undifferentiated.

The following will describe another calculation example for the determination and the update.
Conditions
    First concentration $W_1$: 1.00
    Second concentration $W_2$: −0.60
    Number of cells that are included in the first circle 18 and whose states are differentiated (except for the cell 16a): 5
    Number of cells that are included in the second circle 20 and not included in the first circle 18 and whose states are differentiated: 9
Calculation Example $$E = 1.00 * 5 - 0.60 * 9$$
$$= -0.4$$

In this case, because the value E is negative, the state of the cell 16a is changed to be undifferentiated if the state of the cell 16a is differentiated, and the state of the cell 16a is maintained if the state of the cell 16a is undifferentiated.

The determination and the update are repeated. The number of times of the repetition is M in the flow chart in FIG. 3. The mesh 12 after the repetition of M times is completed is at stage (M+1). As a stage proceeds, the number of cells whose states change by update decreases.

Figure 7:
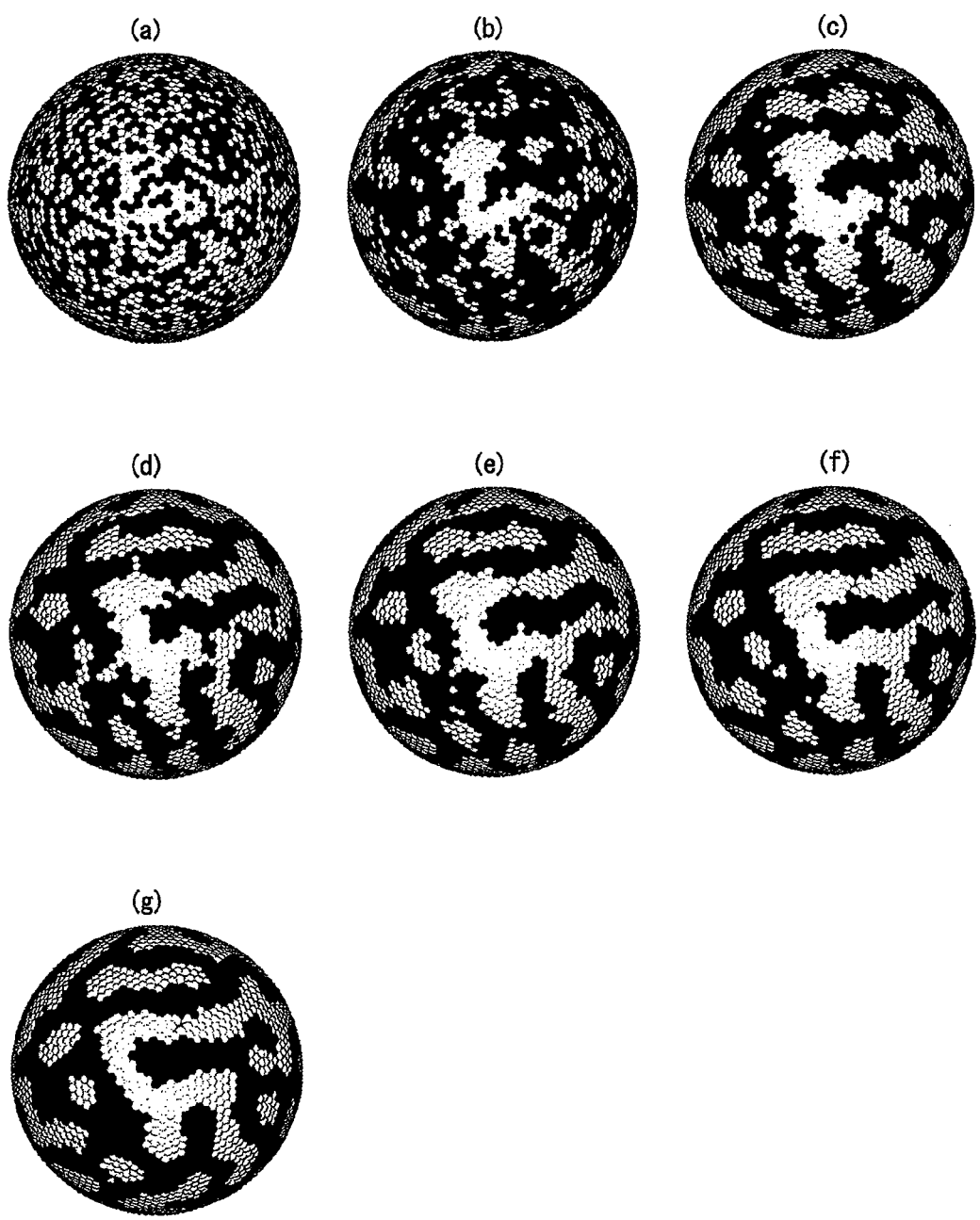
FIG. 7 is a photograph showing 7 patterns during the designing process in FIG. 3.

FIG. 7 is a photograph showing changes in state by the repetition. It is noted that the photograph in FIG. 7 is not a photograph for the golf ball 2 shown in FIG. 2. In FIG. 7, for convenience's sake, differentiated cells are colored in black and undifferentiated cells are colored in white. The details of each photograph are as follows.
    (a) Stage 1, repetition number: 0, initial state
    (b) Stage 2, repetition number: 1
    (c) Stage 3, repetition number: 2
    (d) Stage 4, repetition number: 3
    (e) Stage 5, repetition number: 4
    (f) Stage 6, repetition number: 5
    (g) Stage 31, repetition number: 30

As is clear from FIG. 7, at a stage with a small number of times of the repetition, the change in pattern by update is great. By update being performed a large number of times, the pattern converges. As is clear from FIG. 7, the number of times of the repetition is preferably 3 or greater, and more preferably 5 or greater. If the number of times of the repetition is excessive, a load on the computer is great. In this respect, the number of times of the repetition is preferably 30 or less, and more preferably 10 or less.

Figure 8:
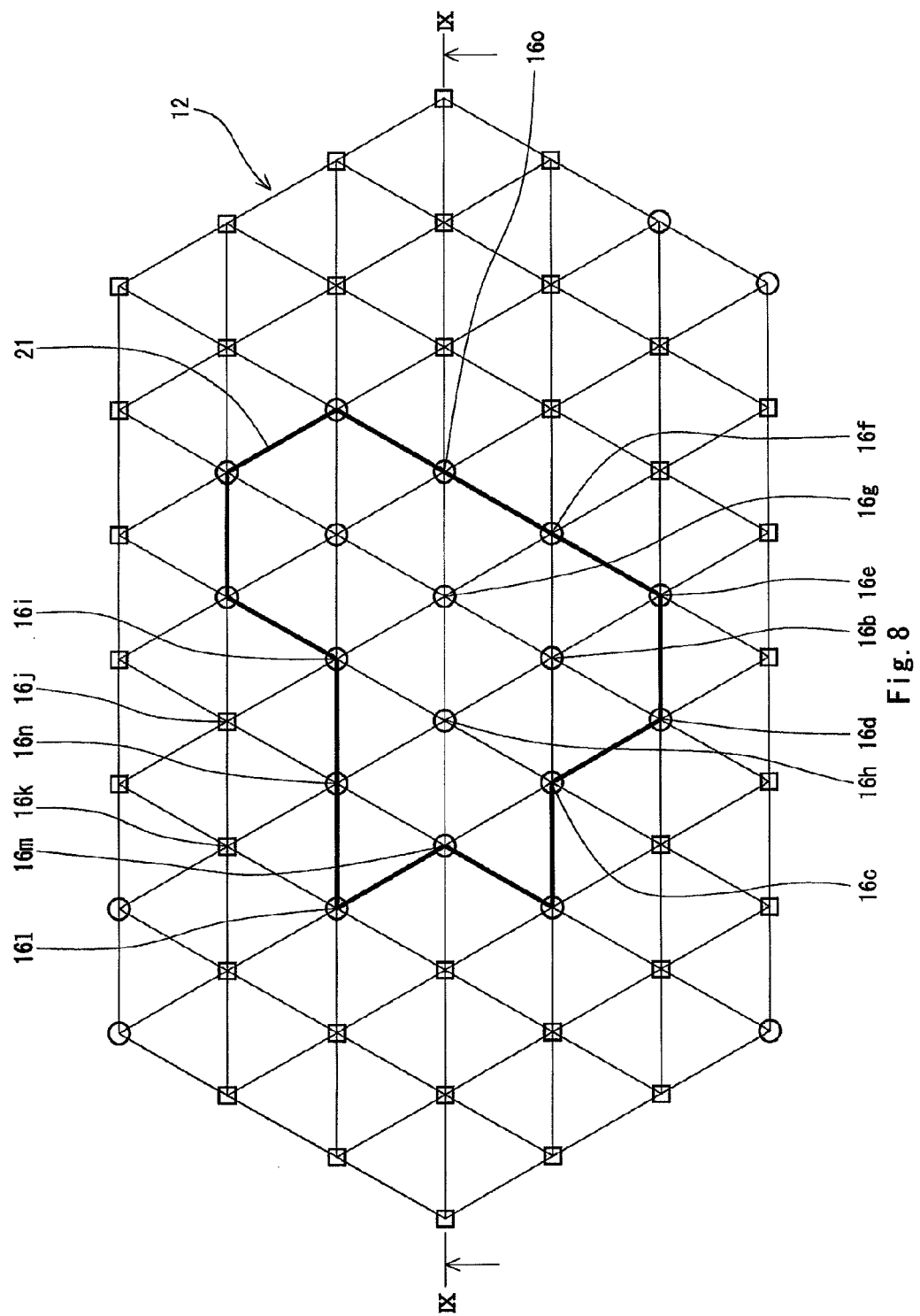
FIG. 8 is a partially enlarged view of the mesh after update is completed.

The determination and the update are repeated M times to fix the state of each cell. This fixing is "to assign a state" to a cell. FIG. 8 is a partially enlarged view of the mesh after assignment of state is completed. In FIG. 8, what is indicated by circles are differentiated cells, and what is indicated by squares are undifferentiated cells. Based on this state, an iflag is assigned to cells. First, "0" is provisionally assigned as an iflag to all the cells. Next, the iflags of the differentiated cells are changed. The cell indicated by a reference sign 16b in FIG. 8 is adjacent to six cells 16c-16h. In the present invention, when a triangle with one cell at one vertex thereof has another cell at another vertex thereof, this state is referred to as where "the one cell is adjacent to the other cell". The states of the cells 16c-16h are differentiated. When the states of all the cells 16c-16h adjacent to the cell 16b are differentiated, the iflag of the cell 16b is changed from "0" to "1". The cell indicated by a reference sign 16n in FIG. 8 is adjacent to six cells 16h-16m. The states of the cells 16h, 16i, 16l and 16m are differentiated. The states of the cells 16j and 16k are undifferentiated. When the cell 16n is adjacent to one or more cells whose states are undifferentiated, the iflag of the cell 16n is changed from "0" to "2". The iflags of all cells whose states are differentiated are changed. The iflags of cells whose states are undifferentiated are not changed. Based on the iflags, attributes are assigned to all the cells (STEP 6). The assignment of attribute is performed based on the following rule.

iflag: 0 attribute: OUTSIDE
    iflag: 1 attribute: INSIDE
    iflag: 2 attribute: BOUNDARY The mesh 12 in which the assignment of attribute is completed is at first phase. By connecting a plurality of cells whose attributes are BOUNDARY, a contour 21 (first contour) is obtained. In FIG. 8, the first contour 21 is indicated by a thick line.

A land 10 or a recess is assigned to each cell in accordance with its attribute (STEP 7). Specifically, a land 10 is assigned to a cell whose attribute is OUTSIDE, a recess is assigned to a cell whose attribute is INSIDE, and a recess is assigned to a cell whose attribute is BOUNDARY.

Figure 9:
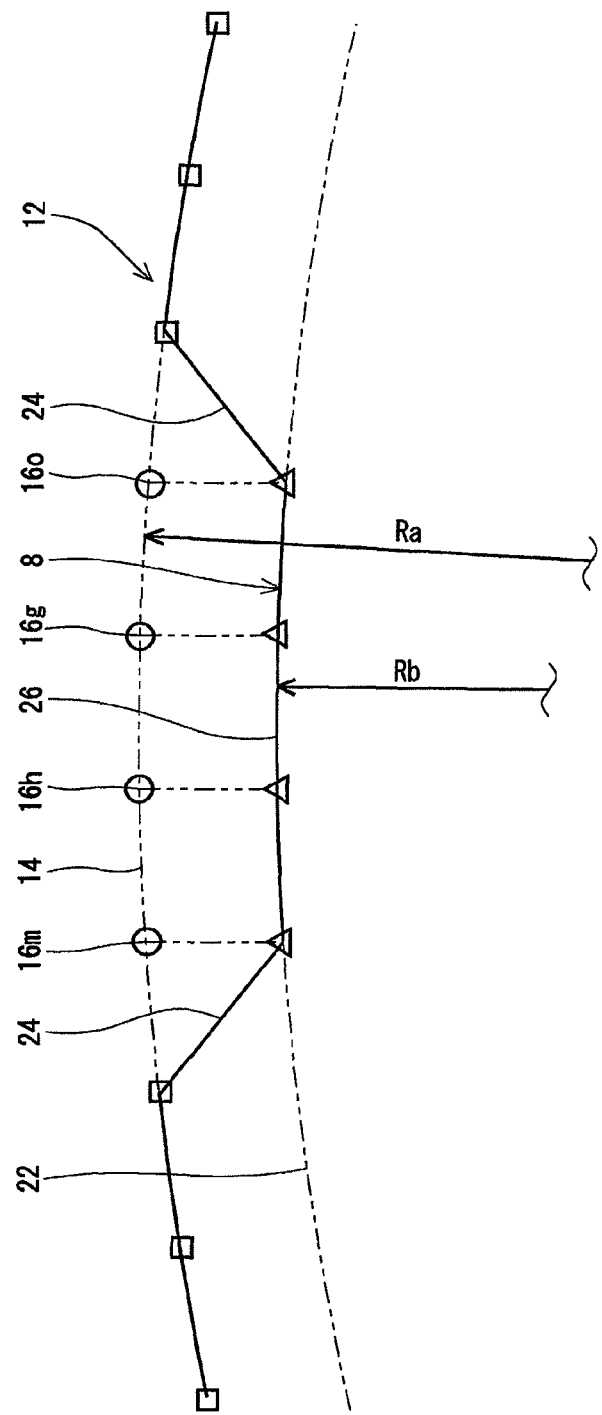
FIG. 9 is a cross-sectional view taken along the line IX-IX in FIG. 8.

FIG. 9 is a cross-sectional view taken along the line IX-IX in FIG. 8. As shown in FIG. 9, the phantom sphere 14 has a radius of Ra. In FIG. 9, a second sphere 22 is also shown. The second sphere 22 is concentric with the phantom sphere 14. The second sphere 22 has a radius of Rb smaller than the radius Ra. The cells 16g and 16h whose attributes are INSIDE are moved along the radial direction of the phantom sphere 14 to the surface of the second sphere 22. The cells 16m and 16o whose attributes are BOUNDARY are also moved along the radial direction of the phantom sphere 14 to the surface of the second sphere 22. The movement distances of the cells 16g, 16h, 16m and 16o are (Ra−Rb). In FIG. 9, what is indicated by triangles are cells which have been moved. Because the radius Rb is smaller than the radius Ra, this movement corresponds to assignment of a recess. As shown in FIG. 9, a crater 8 is formed by continuation of a plurality of recesses. A crater 8 may be formed from a single recess. The undifferentiated cells (indicated by the squares) do not move. Non-movement corresponds to assignment of a land 10. By assigning recesses and lands 10, a rugged pattern is formed. At portions where cells of land and cells of BOUNDARY are adjacent to each other, slopes 24 are formed so as to connect the cells of land to the cells of BOUNDARY that have been moved. The slopes 24 may be arcuate. The movement distance of a cell may be different from the movement distances of other cells. In this case, the crater 8 can have a non-flat bottom surface.

In this embodiment, the crater 8 consists of the slopes 24 and a bottom surface 26. The first contour 21 shown in FIG. 8 is the outer edge of the bottom surface 26. As is clear from FIG. 9, the outer edge of the crater 8 is larger than the first contour 21. The outer edge of the crater 8 depends on the first contour 21. The crater 8 may have another cross-sectional shape.

Figure 10:
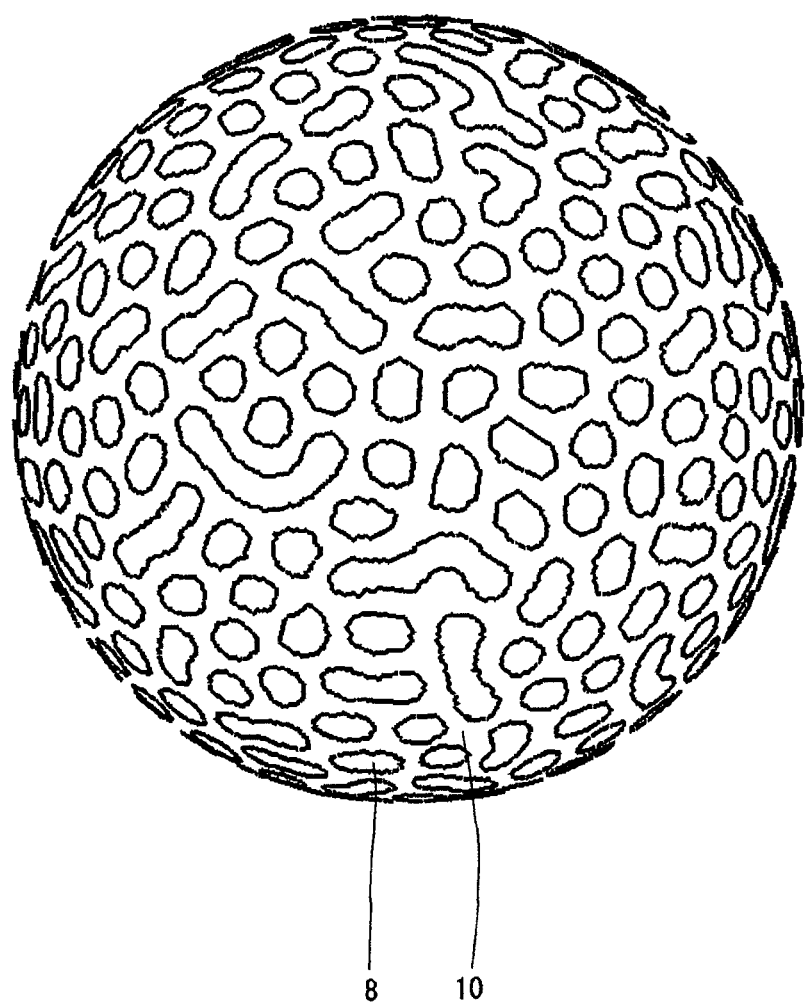
FIG. 10 is a front view of a pattern including a crater in FIG. 9.

A rugged pattern in which this crater 8 has been formed is shown in FIG. 10. This pattern consists of a large number of craters 8 and a land 10. The occupation ratio of this pattern is calculated (STEP 8). In this calculation, the areas defined by the contours of the craters 8 are calculated. The areas of all the craters 8 are summed. The ratio of the sum to the surface area of the phantom sphere 14 is the occupation ratio. The occupation ratio may be approximately calculated by using a large number of triangles shown in FIG. 4. In the approximate calculation, the sum of the areas of triangles included in the craters 8 is divided by the sum of the areas of all the triangles.

Based on the obtained occupation ratio, a determination is performed (STEP 9). At this STEP, whether or not the occupation ratio is equal to or greater than a predetermined value is determined. In the embodiment shown in FIG. 3, whether or not an occupation ratio Y is equal to or greater than 65% is determined.

Figure 11:
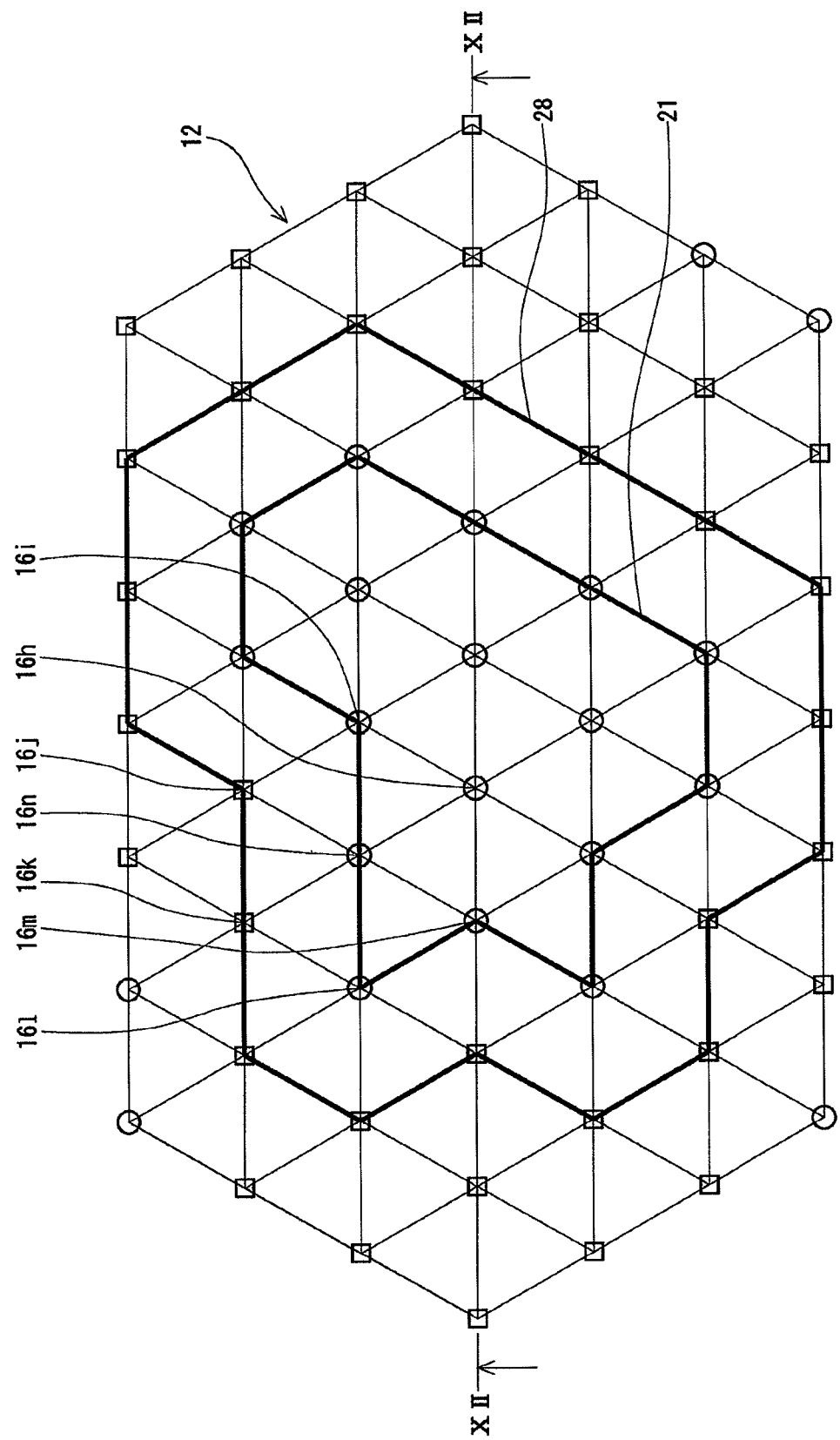
FIG. 11 is a partially enlarged view of the mesh after assignment of attribute is completed.

When the occupation ratio Y is less than 65%, update of attribute is performed (STEP 10). The following will describe a method of this update in detail. FIG. 11 is a partially enlarged view of the mesh after assignment of attribute is completed. The cell indicated by the reference sign 16n is present on the first contour 21. The cell 16n is adjacent to six cells 16h to 16m. The iflag of the cell 16h is "1" and its attribute is INSIDE. The iflag of a cell whose attribute is INSIDE is not changed. The iflags of the cells 16i, 16l and 16m are "2", and their attributes are BOUNDARY. The iflag of a cell whose attribute is BOUNDARY and that is adjacent to another cell whose attribute is BOUNDARY is not changed. The iflags of the cells 16j and 16k are "0", and their attributes are OUTSIDE. The iflag of a cell whose attribute is OUTSIDE and that is adjacent to another cell whose attribute is BOUNDARY is changed from "0" to "3". The iflags of cells adjacent to all the cells present on the first contour 21 are decided. Based on the iflags, the update of attribute is performed (STEP 10). The update of attribute is performed based on the following rule.

iflag: 0 attribute: OUTSIDE
    iflag: 1-2 attribute: INSIDE
    iflag: 3 attribute: BOUNDARY The mesh 12 in which the update of attribute has been performed once is at second phase.

By connecting a plurality of cells whose attributes are BOUNDARY, a contour 28 (second contour) is obtained. A land 10 or a recess is assigned to each cell in accordance with its attribute (STEP 7). Specifically, a land 10 is assigned to a cell whose attribute is OUTSIDE, a recess is assigned to a cell whose attribute is INSIDE, and a recess is assigned to a cell whose attribute is BOUNDARY.

Figure 12:
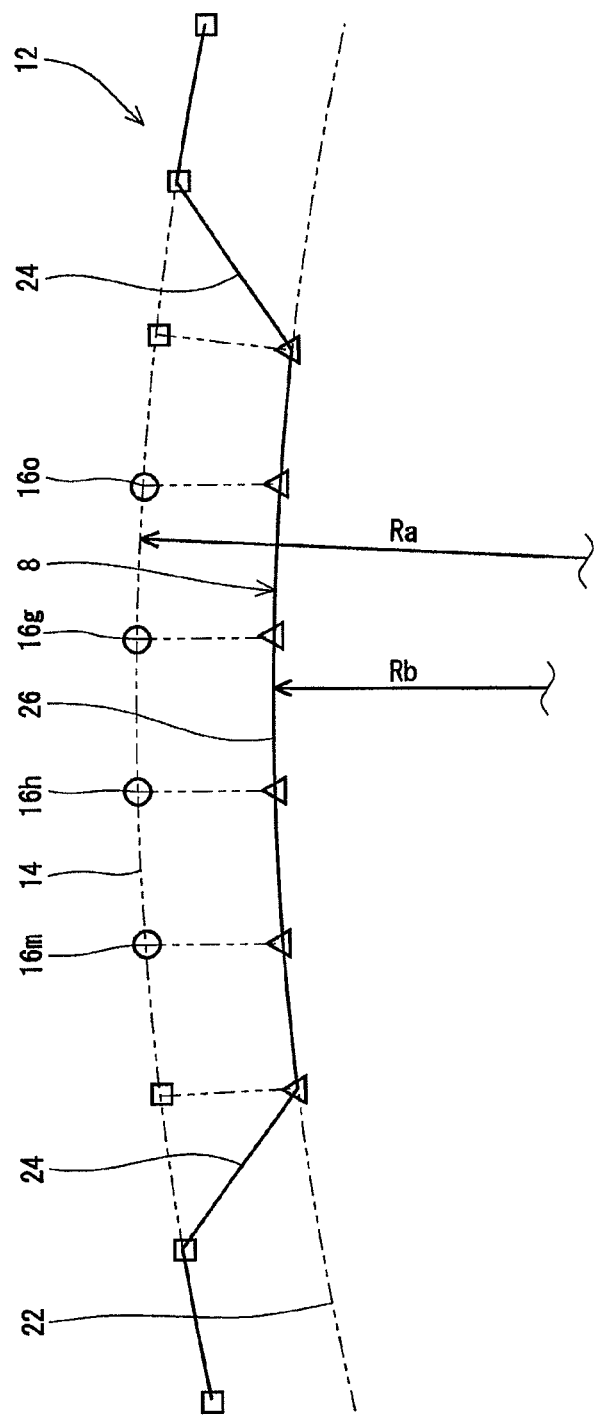
FIG. 12 is a cross-sectional view taken along the line XII-XII in FIG. 11.

FIG. 12 is a cross-sectional view taken along the line XII-XII in FIG. 11. In FIG. 12, a crater 8 is formed by assignment of recess. As is clear from the comparison of FIGS. 9 and 12, the crater 8 is enlarged by the update of attribute. In other words, the occupation ratio becomes great due to the update of attribute.

Figure 13:
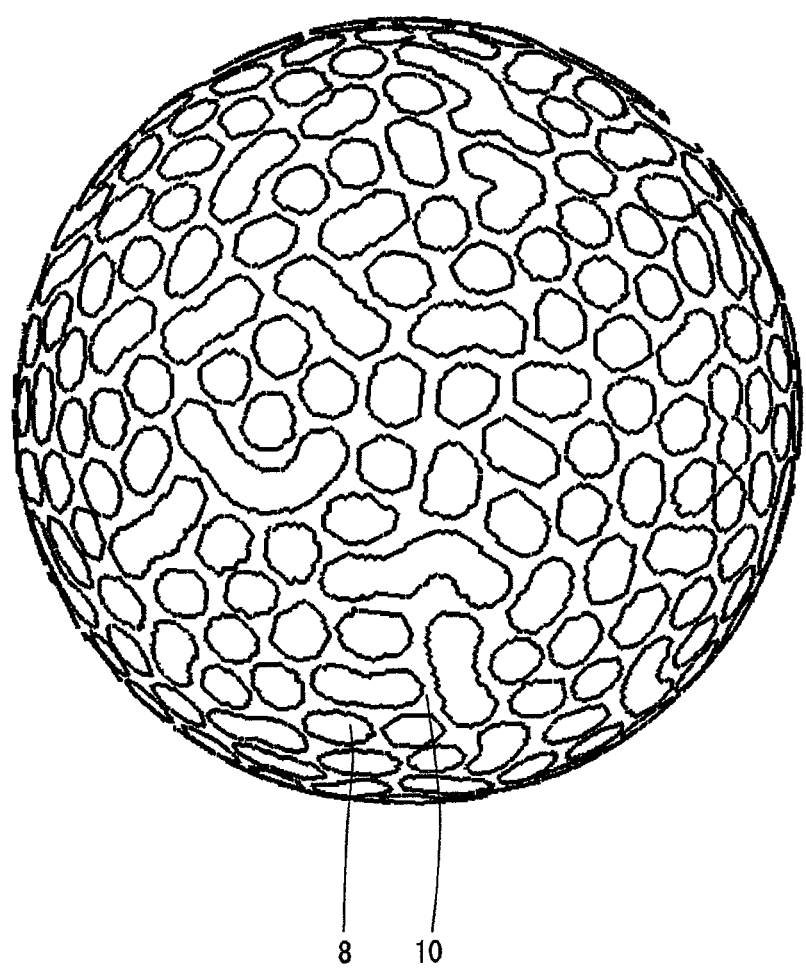
FIG. 13 is a front view of a pattern including a crater in FIG. 12.

A rugged pattern in which this crater 8 has been formed is shown in FIG. 13. As is clear from the comparison of FIGS.

10 and 13, the occupation ratio of the pattern in FIG. 13 is greater than that in FIG. 10. The occupation ratio of this pattern is calculated (STEP 8). Based on the obtained occupation ratio, the determination is performed (STEP 9). At this STEP, whether or not the occupation ratio is equal to or greater than the predetermined value is determined. In the embodiment shown in FIG. 3, whether or not the occupation ratio Y is equal to or greater than 65% is determined. Thereafter, similarly, the update of attribute (STEP 10), the assignment of recess and land 10 (STEP 7), the calculation of occupation ratio (STEP 8), and the determination (STEP 9) are repeated until the occupation ratio Y becomes equal to or greater than 65%. Prior to the update of attribute for the Nth time, the iflag of a cell whose attribute is OUTSIDE and that is adjacent to another cell whose attribute is BOUNDARY is changed from "0" to "N+2". The update of attribute for the Nth time is performed based on the following rule.

iflag: 0 attribute: OUTSIDE
iflag: 1 to N+1 attribute: INSIDE
iflag: N+2 attribute: BOUNDARY The mesh 12 in which the update of attribute has been performed N times is at (N+1)th phase.

The pattern of the golf ball 2 shown in FIG. 2 is obtained by performing the update of attribute 2 times. In other words, the mesh 12 for the pattern is at third phase. As is clear from the comparison of FIGS. 2, 10, and 13, the occupation ratio of the golf ball 2 is great. The occupation ratio of the golf ball 2 is 79%. The golf ball with a great occupation ratio has excellent flight performance. In light of flight performance, the occupation ratio is preferably 65% or greater, more preferably 75% or greater, and particularly preferably 80% or greater. In the golf ball 2 shown in FIG. 2, the craters 8 are arranged in a random manner. The rugged pattern does not have directional properties. The golf ball 2 has excellent aerodynamic symmetry.

Figure 14:
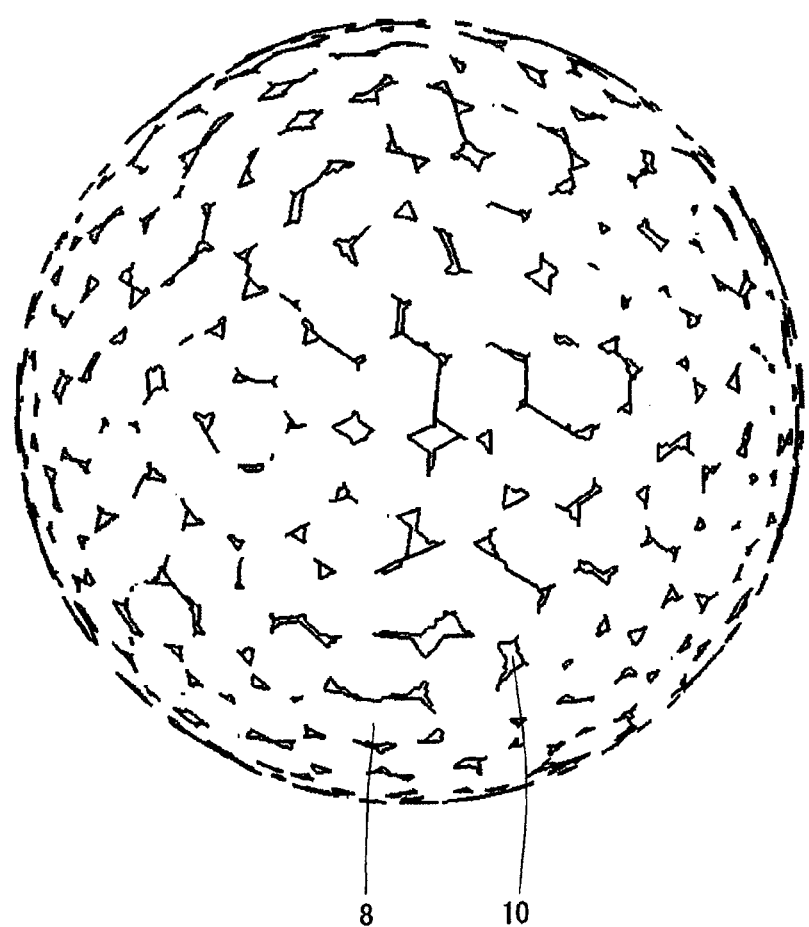
FIG. 14 is a front view of a golf ball according to Example 3.

FIG. 14 is a front view showing a pattern obtained by performing the update of attribute 3 times. In other words, the mesh 12 for this pattern is at fourth phase. In this pattern, the adjacent craters 8 are combined with each other. The occupation ratio of this pattern is extremely great. In this pattern, the area of the land 10 is extremely small. When the golf ball 2 with a small area of the land 10 is hit with a golf club, the land 10 is easy to wear away. In light of durability of the land 10, an excessively great occupation ratio is not preferred. In light of durability of the land 10, the occupation ratio is preferably 95% or less, more preferably 90% or less, and particularly preferably 87% or less.

In order to avoid combining the adjacent craters 8 with each other, craters 8 having small intervals with other craters 8 may not be enlarged, and only the rest of the craters 8 may be enlarged.

In the designing process, BOUNDARY is assigned as an attribute to a cell whose state is differentiated and that is adjacent to a cell whose state is undifferentiated. Alternatively, BOUNDARY may be assigned as an attribute to a cell whose state is undifferentiated and that is adjacent to a cell whose state is differentiated.

In the designing process, matters that influence the determination of whether or not to change the state are the following two matters.

(I) The state of the cell 16
(II) The states of cells located adjacent to the cell 16

In the designing process, the determination is performed based on the following assumption.

(1) A differentiated cell generates an activator that prompts the cell 16 to differentiate.
(2) A differentiated cell generates an inhibitor that returns the cell 16 from the differentiated state to the undifferentiated state.
(3) An undifferentiated cell does not influence the cell 16.
(4) The activator has a great influence power, and the inhibitor has a small influence power.
(5) The activator does not diffuse far away, and the inhibitor diffuses far away.

In the graph shown in FIG. 5, the absolute value of the first concentration $W_1$ is greater than the absolute value of the second concentration $W_2$. The above assumption (4) is reflected in this. In the graph shown in FIG. 5, the index radius $R_2$ is greater than the index radius $R_1$. The above assumption (5) is reflected in this. The influence of the activator and the influence of the inhibitor cancel each other. When the influence of an activator acting on a cell 16 whose state is undifferentiated is greater than the influence of an inhibitor acting on the cell 16, the cell differentiates. When the influence of an inhibitor acting on a cell 16 whose state is differentiated is greater than the influence of an activator acting on the cell 16, the state of the cell 16 is changed to be undifferentiated.

The number of cells, the first concentration $W_1$, the second concentration $W_2$, the index radius $R_1$ and the index radius $R_2$ are factors that influence a pattern. In light of attainment of craters 8 with a width not excessively great, the number of cells is preferably 5000 or greater, more preferably 9000 or greater, even more preferably 20000 or greater, and particularly preferably 40000 or greater. In light of attainment of craters 8 with a width not excessively small, the number of cells is preferably 300000 or less. The craters 8 with an appropriate width prompt turbulent flow separation.

The first concentration $W_1$ is preferably 0.80 or greater and more preferably 0.95 or greater. The first concentration $W_1$ is preferably 1.20 or less and more preferably 1.05 or less. The second concentration $W_2$ is preferably −0.70 or greater and more preferably −0.65 or greater. The second concentration $W_2$ is preferably −0.50 or less and more preferably −0.55 or less. The index radius $R_1$ is preferably 2.20 or greater and more preferably 2.45 or greater. The index radius $R_1$ is preferably 5.0 or less and more preferably 4.6 or less. The index radius $R_2$ is preferably 3.0 or greater and more preferably 3.5 or greater. The index radius $R_2$ is preferably 10.0 or less and more preferably 8.0 or less.

In light of suppression of rising of the golf ball 2 during flight, the depth (Ra−Rb) of the crater 8 is preferably 0.05 mm or greater, more preferably 0.08 mm or greater, and particularly preferably 0.10 mm or greater. In light of suppression of dropping of the golf ball 2 during flight, the depth (Ra−Rb) is preferably 0.60 mm or less, more preferably 0.45 mm or less, and particularly preferably 0.40 mm or less.

In the present invention, the term "crater volume" means the volume of a part surrounded by the surfaces of phantom sphere 14 and the crater 8. In light of suppression of rising of the golf ball 2 during flight, the sum of the volumes (total volume) of the craters 8 is preferably 400 $mm^3$ or greater, more preferably 450 $mm^3$ or greater, and particularly preferably 500 $mm^3$ or greater. In light of suppression of dropping of the golf ball 2 during flight, the total volume is preferably 700 $mm^3$ or less, more preferably 650 $mm^3$ or less, and particularly preferably 600 $mm^3$ or less.

Preferably, the golf ball 2 has a difference dR whose absolute value is 2.5 mm or less. The absolute value is a parameter that correlates with the aerodynamic symmetry of the golf ball 2. The smaller the absolute value is, the smaller the difference between the trajectory during PH rotation and the trajectory during POP rotation is. In this respect, the absolute value is preferably 1.0 mm or less and particularly preferably 0.80 mm or less. The following will describe an evaluation method based on the difference dR.

Figure 15:
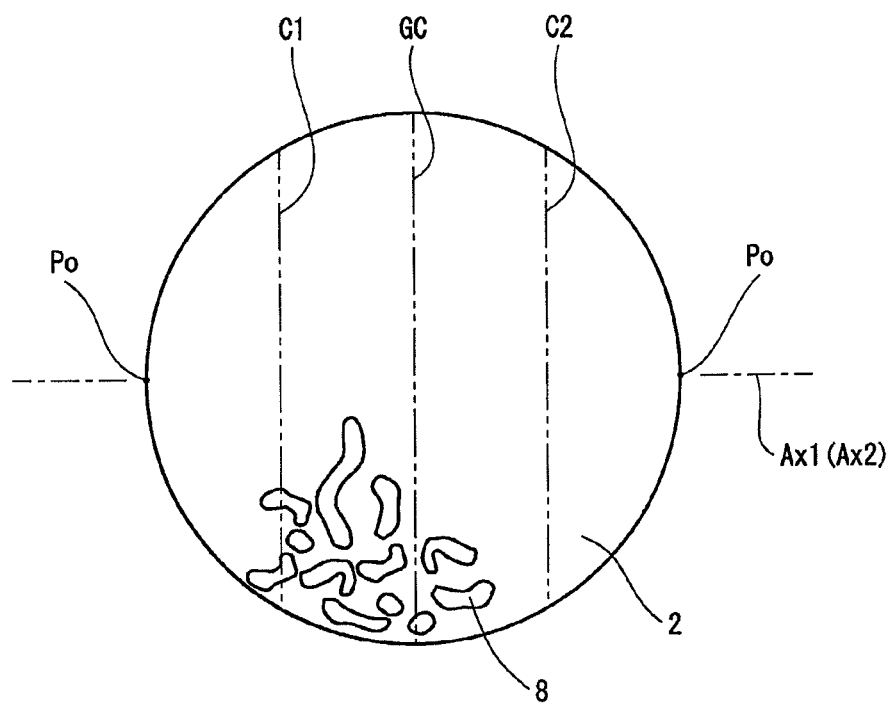
FIG. 15 is a schematic view for explaining a method for evaluating the golf ball in FIG. 1.

FIG. 15 is a schematic view for explaining the evaluation method. In the evaluation method, a first rotation axis Ax1 is assumed. The first rotation axis Ax1 passes through the two poles Po of the golf ball 2. Each pole Po corresponds to the deepest part of the mold used for forming the golf ball 2. One of the poles Po corresponds to the deepest part of an upper mold half, and the other pole Po corresponds to the deepest part of a lower mold half. The golf ball 2 rotates about the first rotation axis Ax1. This rotation is referred to as PH rotation.

Figure 16:
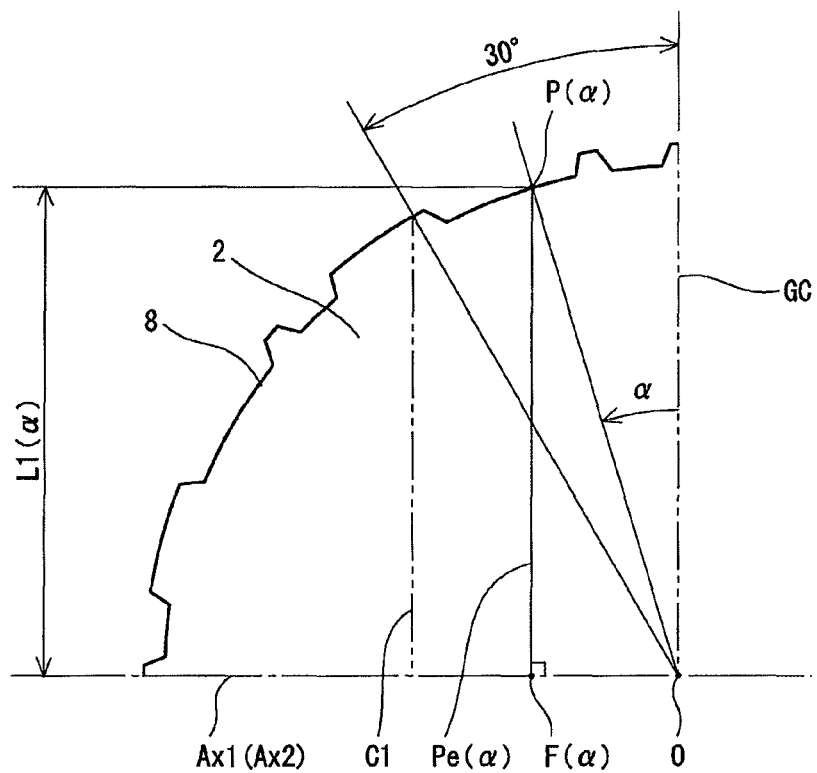
FIG. 16 is a schematic view for explaining the evaluation method in FIG. 15.

There is assumed a great circle GC that exists on the surface of the phantom sphere 14 of the golf ball 2 and is orthogonal to the first rotation axis Ax1. The circumferential speed of the great circle GC is faster than any other part of the golf ball 2 during rotation of the golf ball 2. In addition, there are assumed two small circles C1 and C2 that exist on the surface of the phantom sphere 14 of the golf ball 2 and are orthogonal to the first rotation axis Ax1. FIG. 16 schematically shows a partial cross-sectional view of the golf ball 2 in FIG. 15. In FIG. 16, the right-to-left direction is the direction of the first rotation axis Ax1. As shown in FIG. 16, the absolute value of the central angle between the small circle C1 and the great circle GC is 30°. Although not shown in the drawing, the absolute value of the central angle between the small circle C2 and the great circle GC is also 30°. The phantom sphere 14 is divided at the small circles C1 and C2, and of the surface of the golf ball 2, a region sandwiched between the small circles C1 and C2 is defined.

In FIG. 16, a point $P(\alpha)$ is the point that is located on the surface of the golf ball 2 and of which the central angle with the great circle GC is $\alpha°$ (degree). A point $F(\alpha)$ is a foot of a perpendicular line $Pe(\alpha)$ that extends downward from the point $P(\alpha)$ to the first rotation axis Ax1. What is indicated by an arrow $L1(\alpha)$ is the length of the perpendicular line $Pe(\alpha)$. In other words, the length $L1(\alpha)$ is the distance between the point $P(\alpha)$ and the first rotation axis Ax1. For one cross section, the lengths $L1(\alpha)$ are calculated at 21 points $P(\alpha)$. Specifically, the lengths $L1(\alpha)$ are calculated at angles $\alpha$ of −30°, −27°, −24°, −21°, −18°, −15°, −12°, −9°, −6°, −3°, −0°, 3°, 6°, 9°, 12°, 15°, 18°, 21°, 24°, 27° and 30°. The 21 lengths $L1(\alpha)$ are summed to obtain a total length L2 (mm). The total length L2 is a parameter dependent on the surface shape in the cross section shown in FIG. 16.

Figure 17:
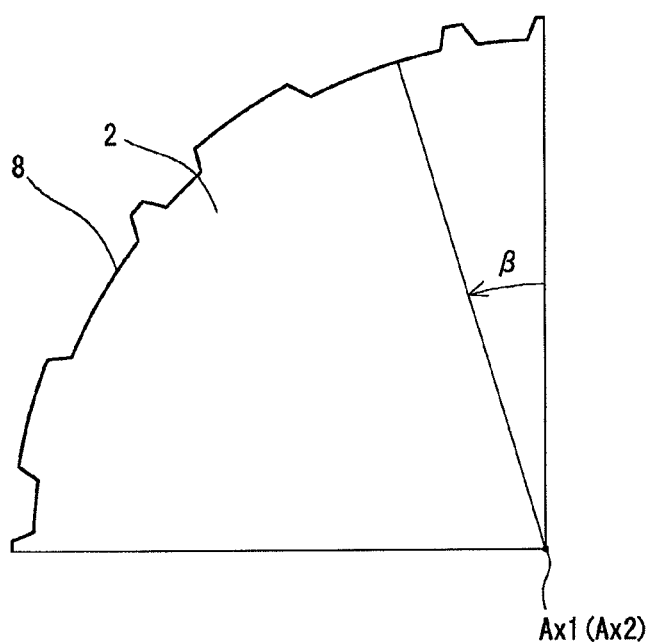
FIG. 17 is a schematic view for explaining the evaluation method in FIG. 15.

FIG. 17 shows a partial cross section of the golf ball 2. In FIG. 17, the direction perpendicular to the surface of the sheet is the direction of the first rotation axis Ax1. In FIG. 17, what is indicated by a reference sign β is a rotation angle of the golf ball 2. In a range equal to or greater than 0° and smaller than 360°, the rotation angles β are set at an interval of an angle of 0.25°. At each rotation angle, the total length L2 is calculated. As a result, 1440 total lengths L2 are obtained along the rotation direction. In other words, a data constellation regarding a parameter dependent on a surface shape appearing at a predetermined point moment by moment during one rotation of the golf ball 2, is calculated. The data constellation is calculated based on the 30240 lengths L1.

Figure 18:
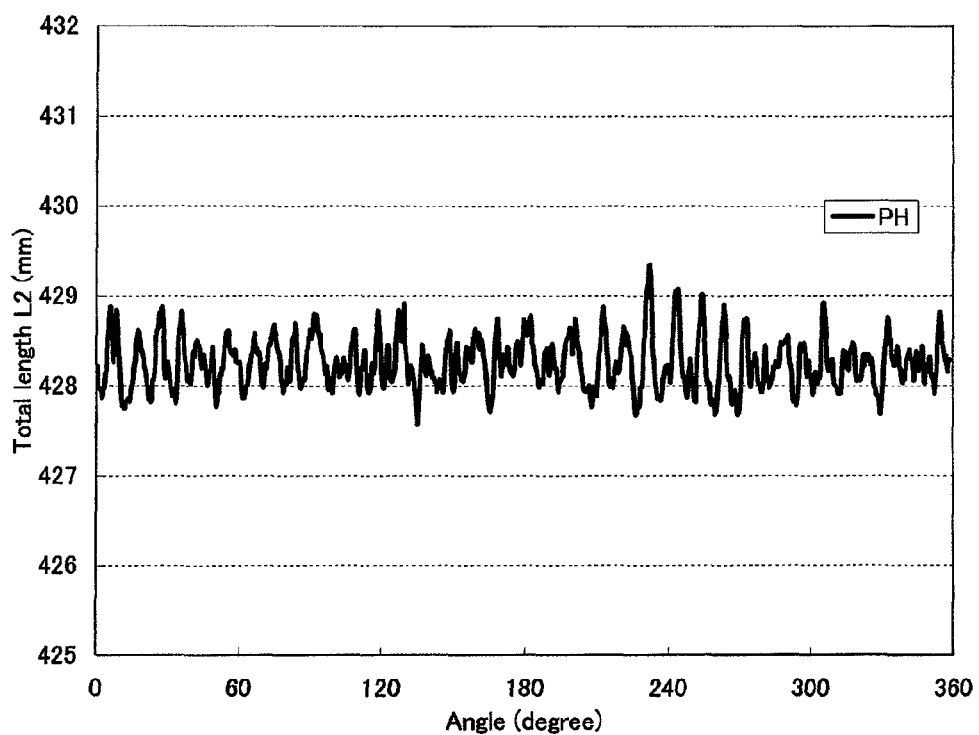
FIG. 18 is a graph showing an evaluation result of the golf ball in FIG. 2.

FIG. 18 shows a graph plotting the data constellation of the golf ball 2 shown in FIG. 2. In this graph, the horizontal axis indicates the rotation angle β, and the vertical axis indicates the total length L2. From this graph, the maximum and minimum values of the total length L2 are determined. The minimum value is subtracted from the maximum value to calculate a fluctuation range Rh. The fluctuation range Rh is a numeric value indicating an aerodynamic characteristic during PH rotation.

Figure 19:
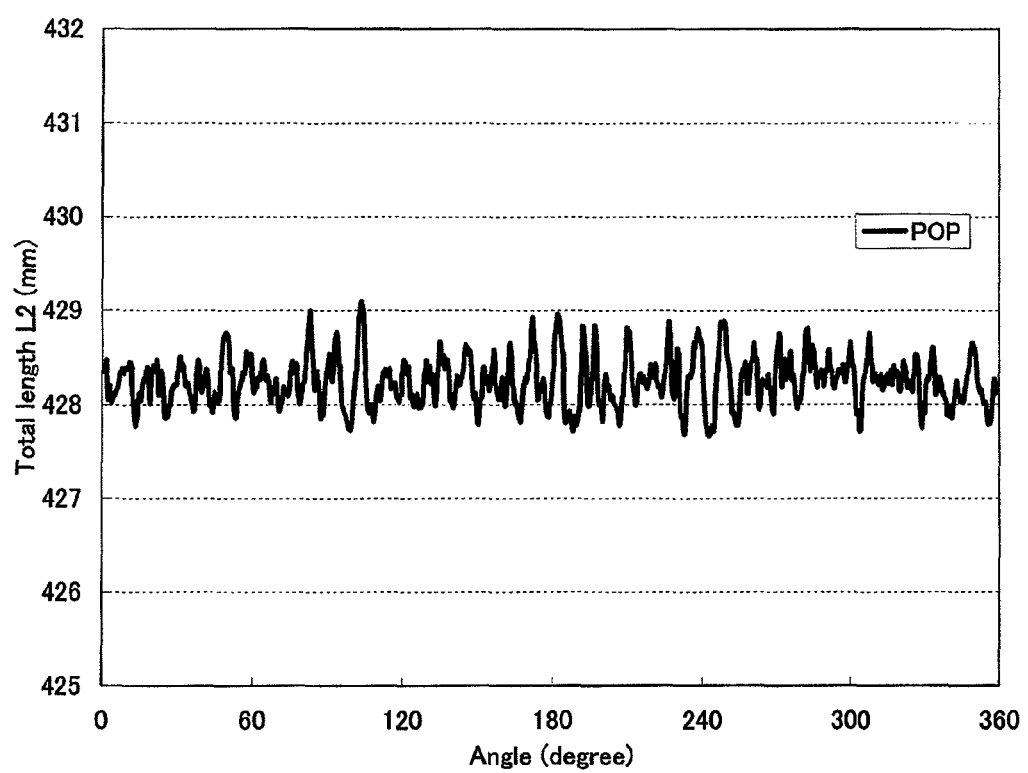
FIG. 19 is a graph showing another evaluation result of the golf ball in FIG. 2.

Further, a second rotation axis Ax2 orthogonal to the first rotation axis Ax1 is determined. Rotation of the golf ball 2 about the second rotation axis Ax2 is referred to as POP rotation. Similarly as for PH rotation, for POP rotation, a great circle GC and two small circles C1 and C2 are assumed. The absolute value of the central angle between the small circle C1 and the great circle GC is 30°. The absolute value of the central angle between the small circle C2 and the great circle GC is also 30°. For a region sandwiched between the small circles C1 and C2 among the surface of the golf ball 2, 1440 total lengths L2 are calculated. In other words, a data constellation regarding a parameter dependent on a surface shape appearing at a predetermined point moment by moment during one rotation of the golf ball 2, is calculated. FIG. 19 shows a graph plotting the data constellation of the golf ball 2 shown in FIG. 2. In this graph, the horizontal axis indicates the rotation angle β, and the vertical axis indicates the total length L2. From this graph, the maximum and minimum values of the total length L2 are determined. The minimum value is subtracted from the maximum value to calculate a fluctuation range Ro. The fluctuation range Ro is a numeric value indicating an aerodynamic characteristic during POP rotation. The fluctuation range Ro is subtracted from the fluctuation range Rh to calculate the difference dR. The difference dR is a parameter indicating the aerodynamic symmetry of the golf ball 2. According to the finding by the inventors of the present invention, the golf ball 2 with a small absolute value of the difference dR has excellent aerodynamic symmetry. It is inferred that this is because the similarity between the surface shape during PH rotation and the surface shape during POP rotation is high.

There are numerous straight lines orthogonal to the first rotation axis Ax1. Thus, there are also numerous great circles GC. A great circle GC, whose part included in the craters 8 is the longest, is selected, and a fluctuation range Ro and a difference dR are calculated. Instead of this, 20 great circles GC may be extracted in a random manner, and 20 fluctuation ranges Ro may be calculated based on the extracted 20 great circles GC. In this case, a difference dR is calculated based on the maximum value among 20 pieces of data.

The smaller the fluctuation range Rh is, the larger the flight distance at PH rotation is. In this respect, the fluctuation range Rh is preferably 3.0 mm or less and more preferably 2.8 mm or less. The smaller the fluctuation range Ro is, the larger the flight distance at POP rotation is. In this respect, the fluctuation range Ro is preferably 3.0 mm or less and more preferably 2.8 mm or less. In light of attainment of a long flight distance at any of PH rotation and POP rotation, both of the fluctuation range Rh and the fluctuation range Ro are preferably 3.0 mm or less and more preferably 2.8 mm or less.

In the designing process, the assignment of state to a cell is performed by the Cellular Automaton method. The assignment of state to a cell may be performed by other methods.

EXAMPLES

Example 1

By the process shown in FIG. 3, the rugged pattern shown in FIG. 2 was designed. The details of the factors that influence the pattern are as follows.
Number of cells: 88266
First concentration $W_1$: 1.00
Second concentration $W_2$: −0.60

Index radius $R_1$: 4.6
Index radius $R_2$: 8.0
Update of attribute of cell: 2 times (third phase)
Depth of crater (Ra−Rb): 0.1352 mm Examples 2 and 3 and Comparative Example 1

Rugged patterns of Examples 2 and 3 and Comparative Example 1 were designed in a similar manner as Example 1, except the number of times of attribute update and the depth of craters were as shown in the following Table 1.

Comparative Example 2

Figure 20:
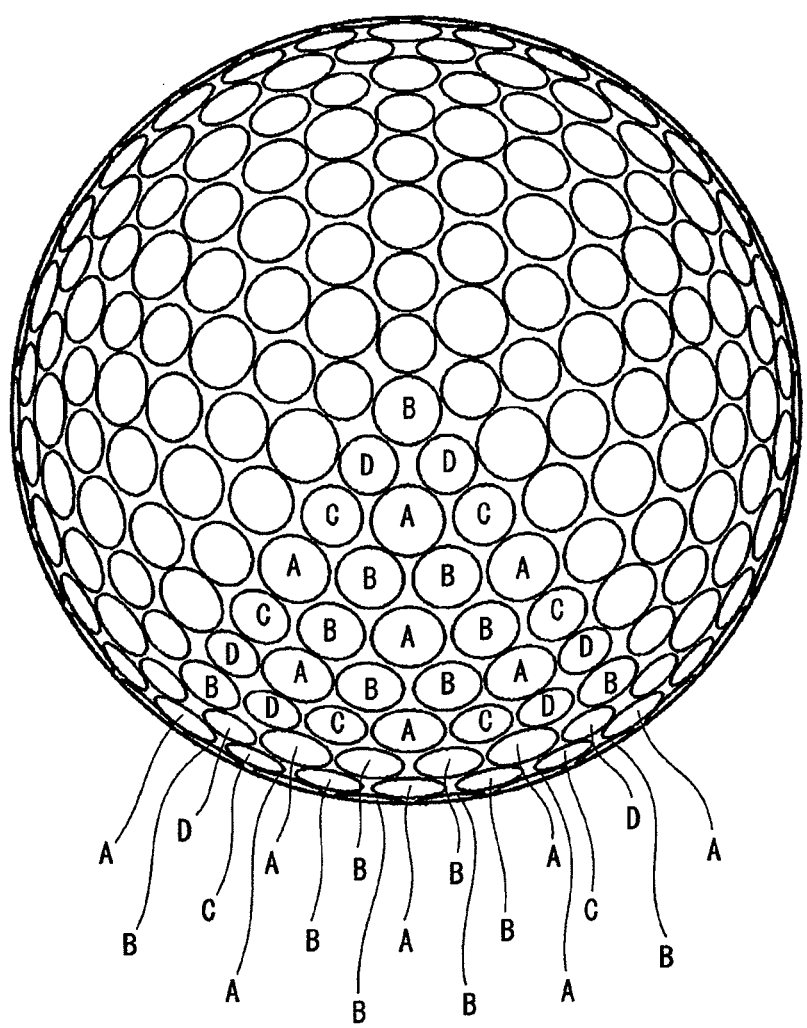
FIG. 20 is a front view of a golf ball according to Comparative Example 2.

The dimple pattern shown in FIG. 20 was designed. In FIG. 20, the kinds of dimples in one unit are indicated by reference signs. This unit is obtained by dividing a spherical surface into ten. The dimple pattern of this unit is developed all over the spherical surface. The dimple pattern has dimples A with a diameter of 4.00 mm, dimples B with a diameter of 3.70 mm, dimples C with a diameter of 3.40 mm, and dimples D with a diameter of 3.20 mm. Each dimple has an arcuate cross-section shape. The details of the dimples are as follows.

| Kind | Number | Diameter (mm) | Depth (mm) | Volume (mm³) |
| --- | --- | --- | --- | --- |
| A | 120 | 4.00 | 0.184 | 1.737 |
| B | 152 | 3.70 | 0.184 | 1.414 |
| C | 60 | 3.40 | 0.184 | 1.137 |
| D | 60 | 3.20 | 0.184 | 0.977 |

Example 4

Figure 22:
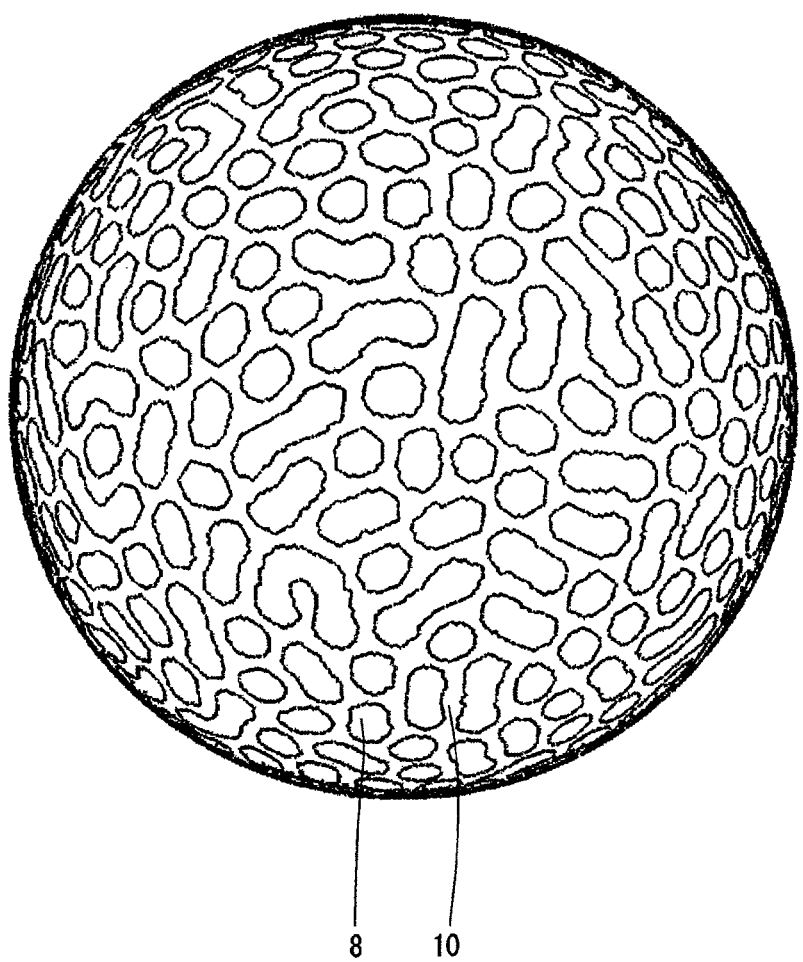
FIG. 22 is a front view of a golf ball according to Example 4.

By the process shown in FIG. 3, the rugged pattern shown in FIG. 22 was designed. The details of the factors that influence the pattern are as follows.

Number of cells: 157045
First concentration $W_1$: 1.00
Second concentration $W_2$: −0.60
Index radius $R_1$: 4.6
Index radius $R_2$: 8.0
Update of attribute of cell: 1 time (second phase)
Depth of crater (Ra−Rb): 0.1814 mm Examples 5 and 6 and Comparative Example 3

Rugged patterns of Examples 5 and 6 and Comparative Example 3 were designed in a similar manner as Example 4, except the number of times of attribute update and the depth of craters were as shown in the following Table 2.

Example 7

Figure 26:
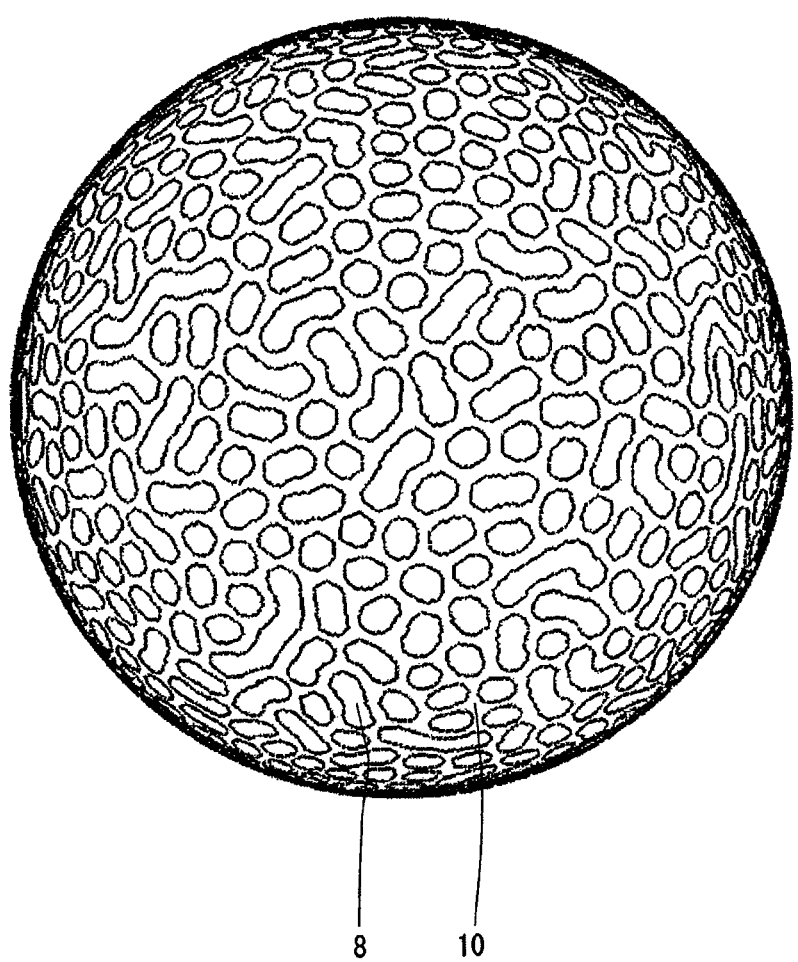
FIG. 26 is a front view of a golf ball according to Example 7.

By the process shown in FIG. 3, the rugged pattern shown in FIG. 26 was designed. The details of the factors that influence the pattern are as follows.

Number of cells: 279329
First concentration $W_1$: 1.00
Second concentration $W_2$: −0.60
Index radius $R_1$: 4.6
Index radius $R_2$: 8.0
Update of attribute of cell: 1 time (second phase)
Depth of crater (Ra−Rb): 0.1814 mm Examples 8 and 9 and Comparative Example 4

Rugged patterns of Examples 8 and 9 and Comparative Example 4 were designed in a similar manner as Example 7, except the number of times of attribute update and the depth of craters were as shown in the following Table 3.

[Evaluation]

By the aforementioned method, the difference dR of each pattern was calculated. The details of the results are shown in the following Tables 1 to 3.

TABLE 1

Results of Evaluation

Figure 29:
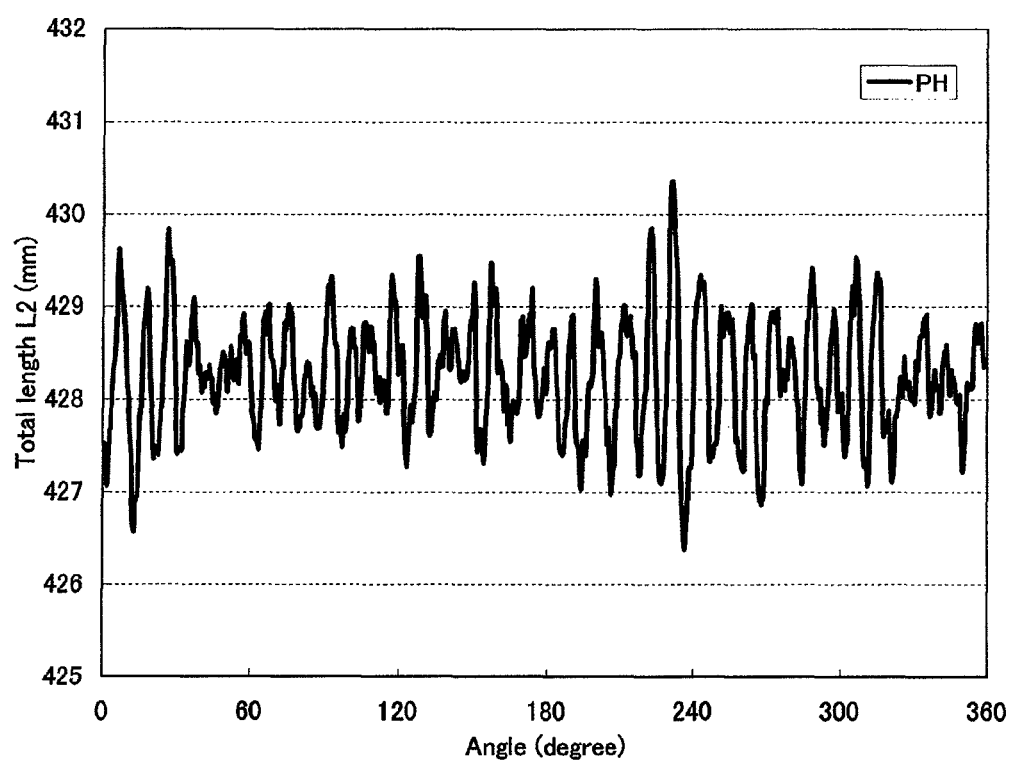
FIG. 29 is a graph showing an evaluation result of the golf ball in FIG. 10.
Figure 30:
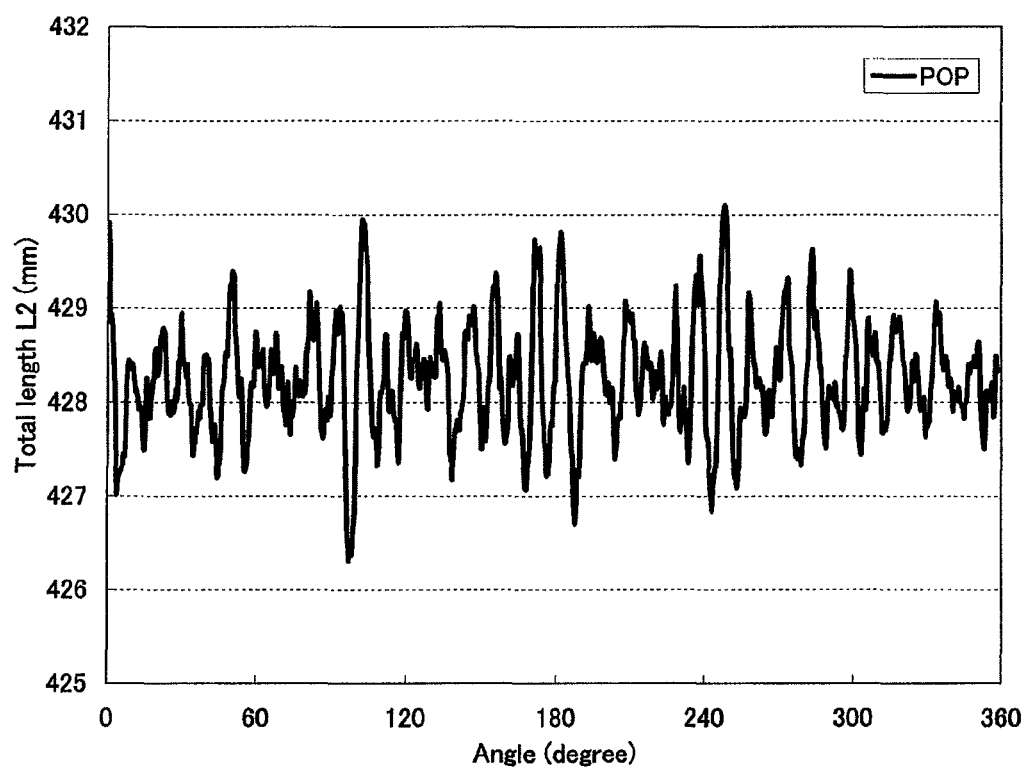
FIG. 30 is a graph showing another evaluation result of the golf ball in FIG. 10.
Figure 31:
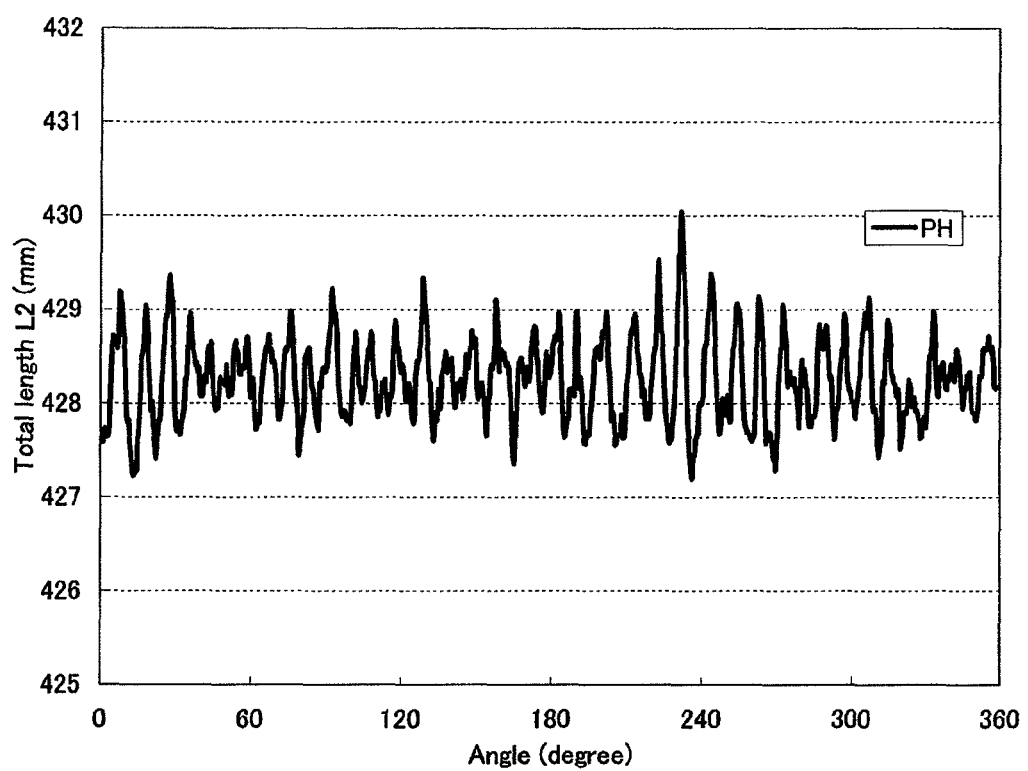
FIG. 31 is a graph showing an evaluation result of the golf ball in FIG. 13.
Figure 32:
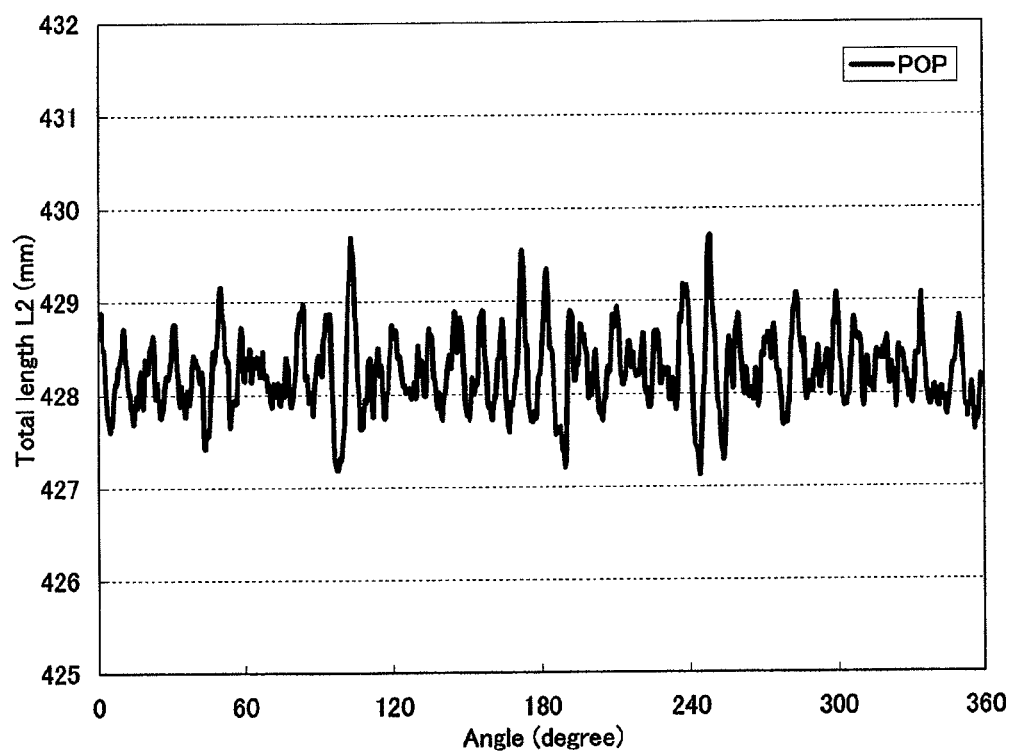
FIG. 32 is a graph showing another evaluation result of the golf ball in FIG. 13.
Figure 33:
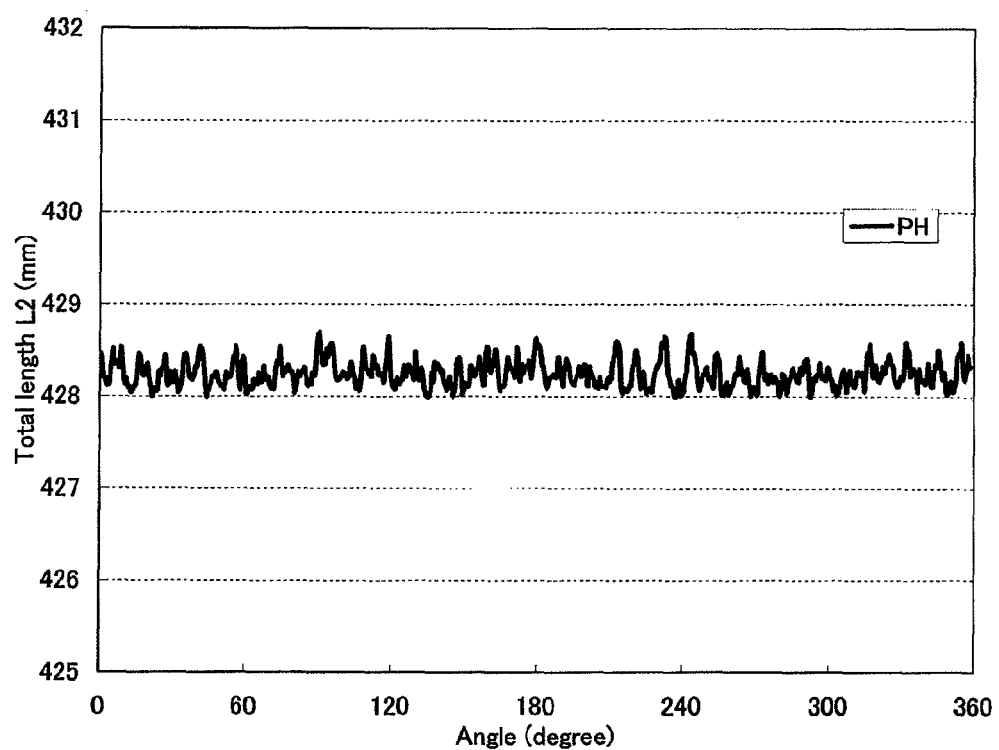
FIG. 33 is a graph showing an evaluation result of the golf ball in FIG. 14.
Figure 34:
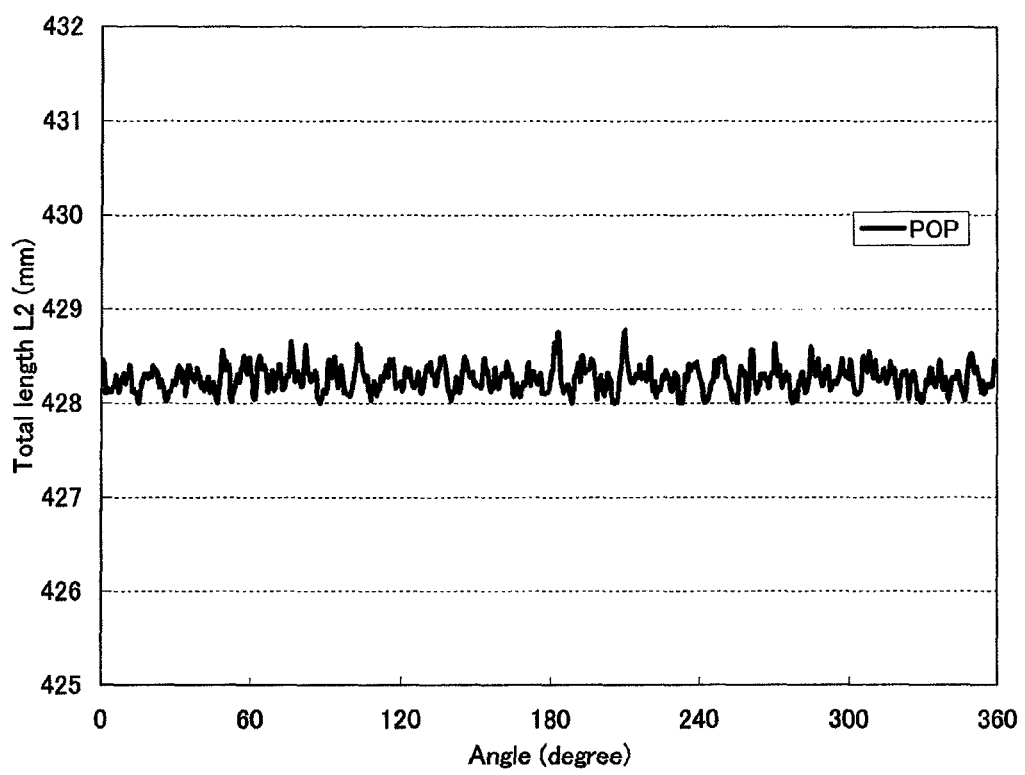
FIG. 34 is a graph showing another evaluation result of the golf ball in FIG. 14.
Figure 35:
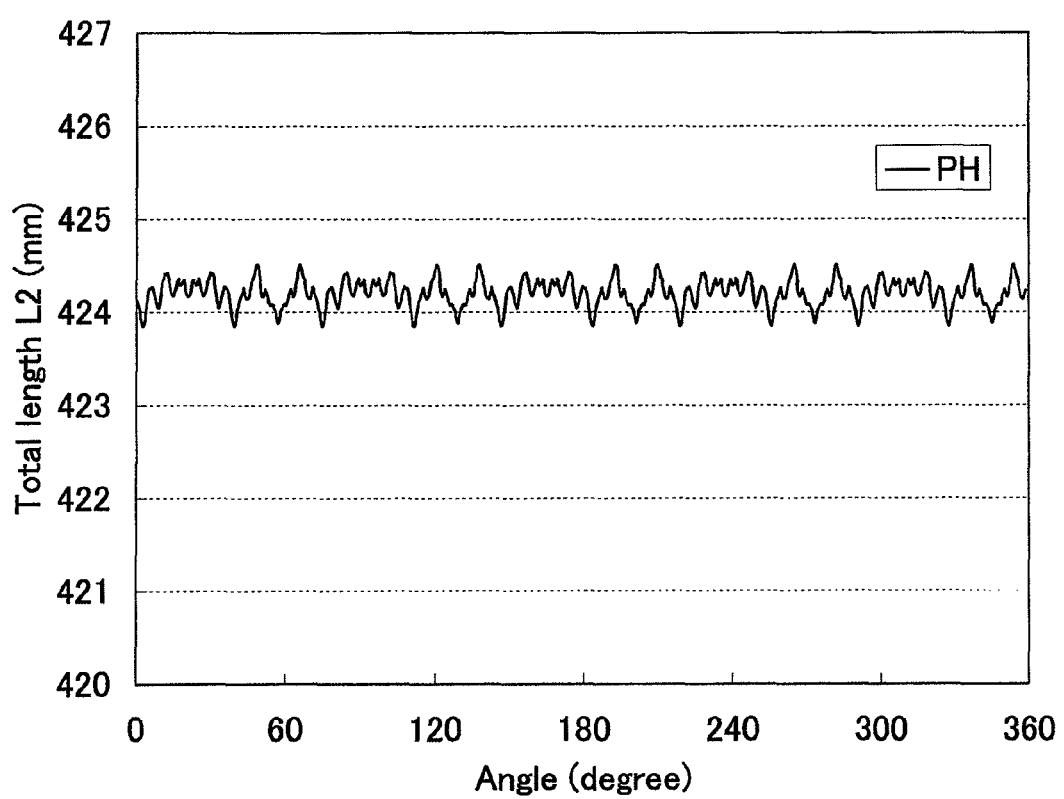
FIG. 35 is a graph showing an evaluation result of the golf ball in FIG. 20.
Figure 36:
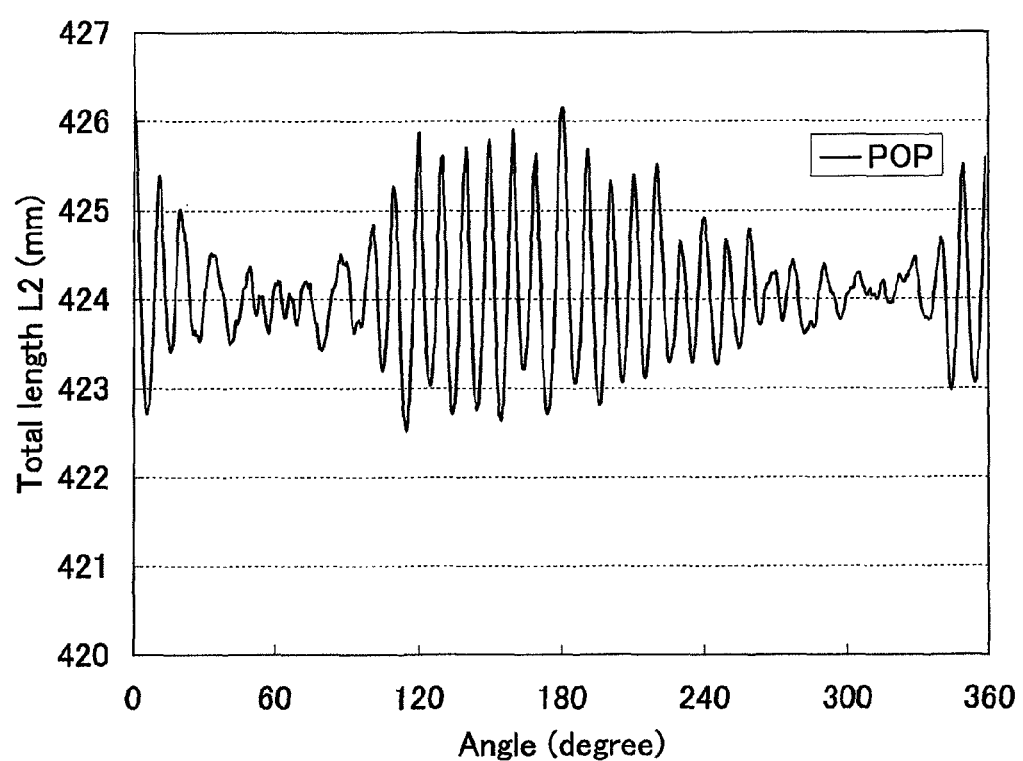
FIG. 36 is a graph showing another evaluation result of the golf ball in FIG. 20.

| | | Compara. Example 1 | Example 2 | Example 1 | Example 3 | Compara. Example 2 |
| --- | --- | --- | --- | --- | --- | --- |
| Number of cells | | 88266 | 88266 | 88266 | 88266 | — |
| Number of times of attribute update n | | 0 | 1 | 2 | 3 | — |
| Phase | | First phase | Second phase | Third phase | Fourth phase | — |
| Pattern | | FIG. 10 | FIG. 13 | FIG. 2 | FIG. 14 | FIG. 20 |
| Occupation ratio (%) | | 44 | 60 | 79 | 95 | 73 |
| Depth (mm) | | 0.2617 | 0.1821 | 0.1352 | 0.1061 | 0.184 |
| Total volume (mm³) | | 550 | 550 | 550 | 550 | 554 |
| PH rotation | Graph | FIG. 29 | FIG. 31 | FIG. 18 | FIG. 33 | FIG. 35 |
| | L2 Maximum | 430.35 | 430.05 | 429.35 | 428.70 | 424.51 |
| | L2 Minimum | 426.38 | 427.20 | 427.58 | 428.00 | 423.85 |
| | L2 Average | 428.26 | 428.26 | 428.26 | 428.25 | 424.20 |
| | Rh | 3.97 | 2.85 | 1.77 | 0.70 | 0.66 |
| POP rotation | Graph | FIG. 30 | FIG. 32 | FIG. 19 | FIG. 34 | FIG. 36 |
| | L2 Maximum | 430.10 | 429.71 | 429.10 | 428.78 | 426.15 |
| | L2 Minimum | 426.30 | 427.13 | 427.67 | 428.00 | 422.52 |
| | L2 Average | 428.24 | 428.25 | 428.25 | 428.26 | 424.06 |
| | Ro | 3.80 | 2.58 | 1.43 | 0.78 | 3.63 |
| Absolute value of dR | | 0.17 | 0.27 | 0.34 | 0.08 | 2.97 |

TABLE 2

Results of Evaluation

Figure 21:
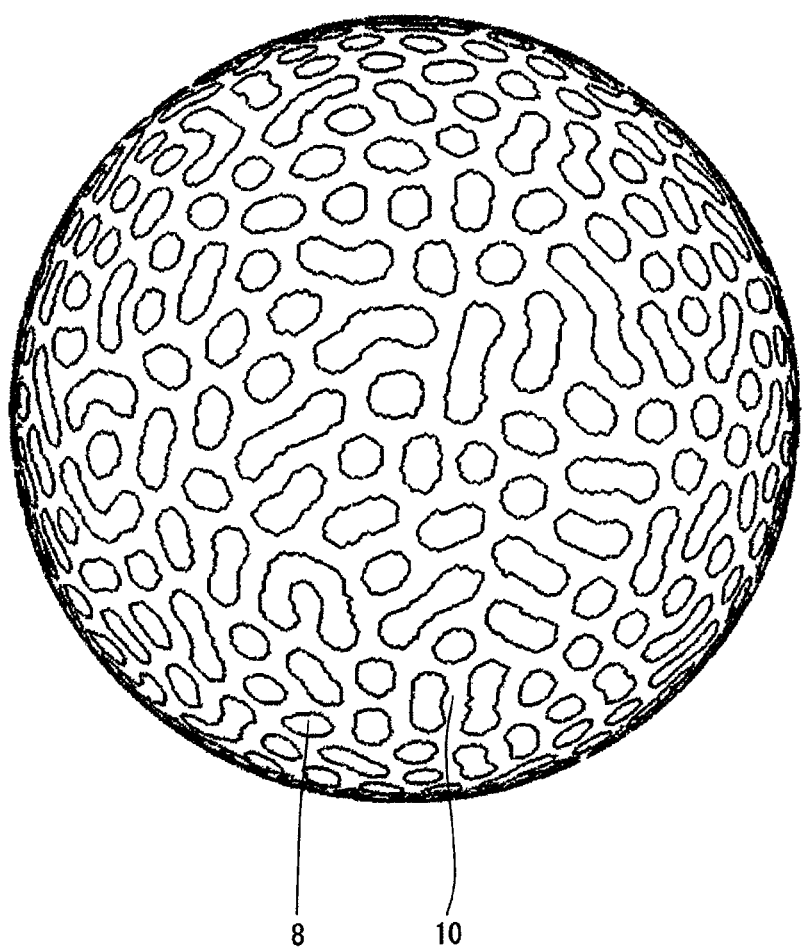
FIG. 21 is a front view of a golf ball according to Comparative Example 3.
Figure 23:
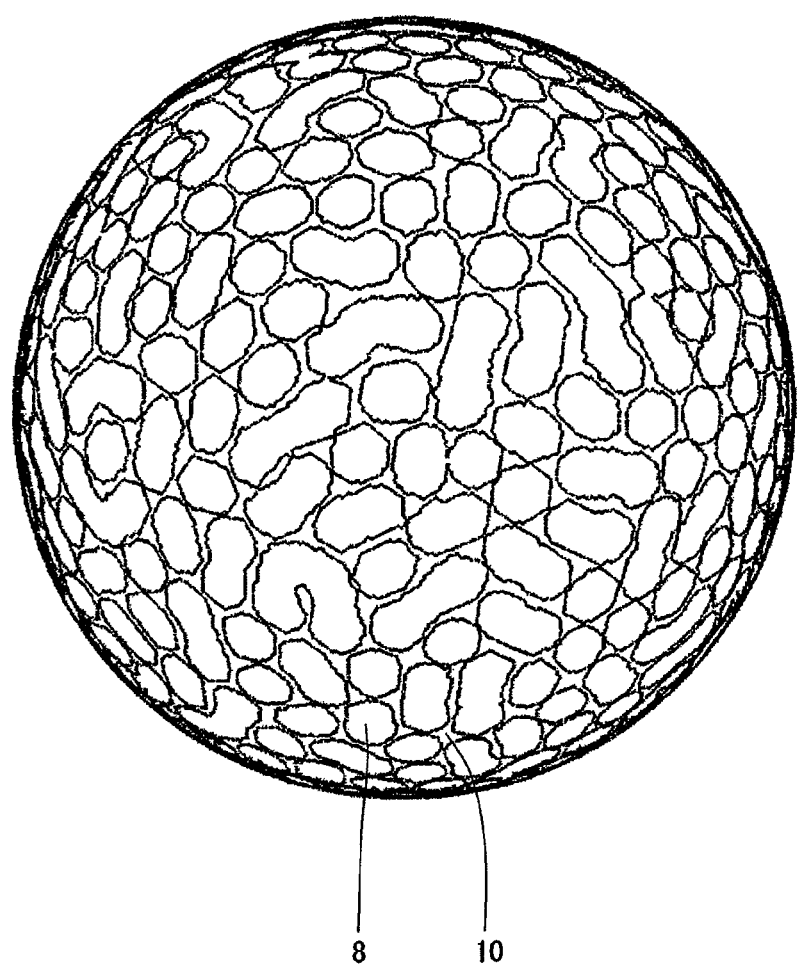
FIG. 23 is a front view of a golf ball according to Example 5.
Figure 24:
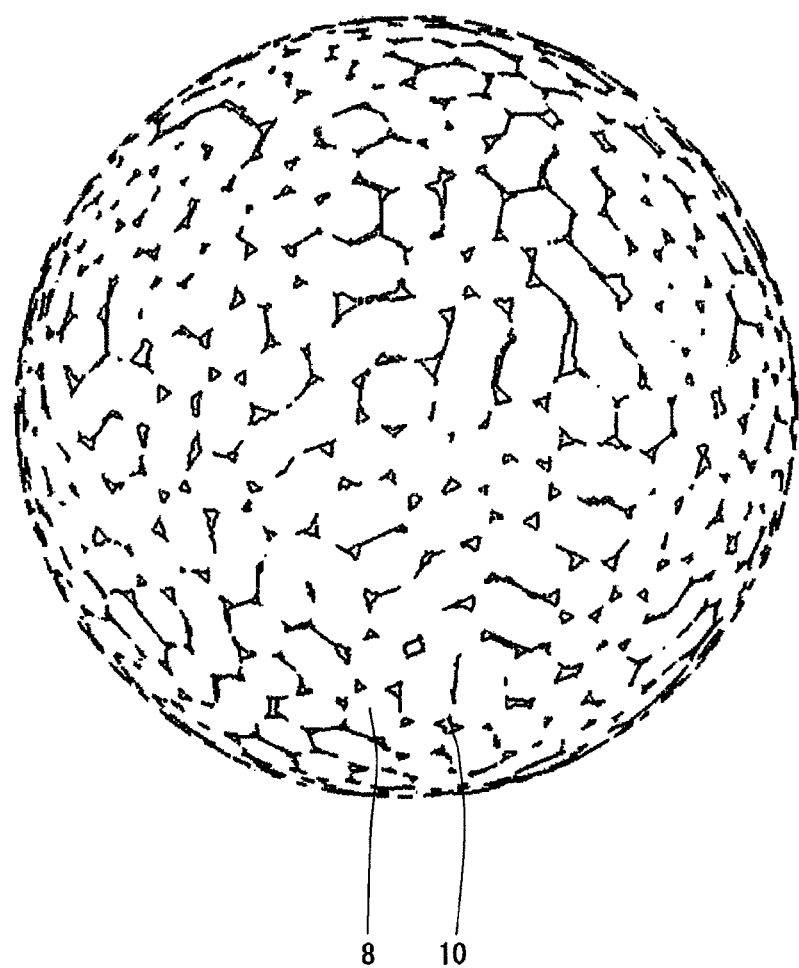
FIG. 24 is a front view of a golf ball according to Example 6.
Figure 37:
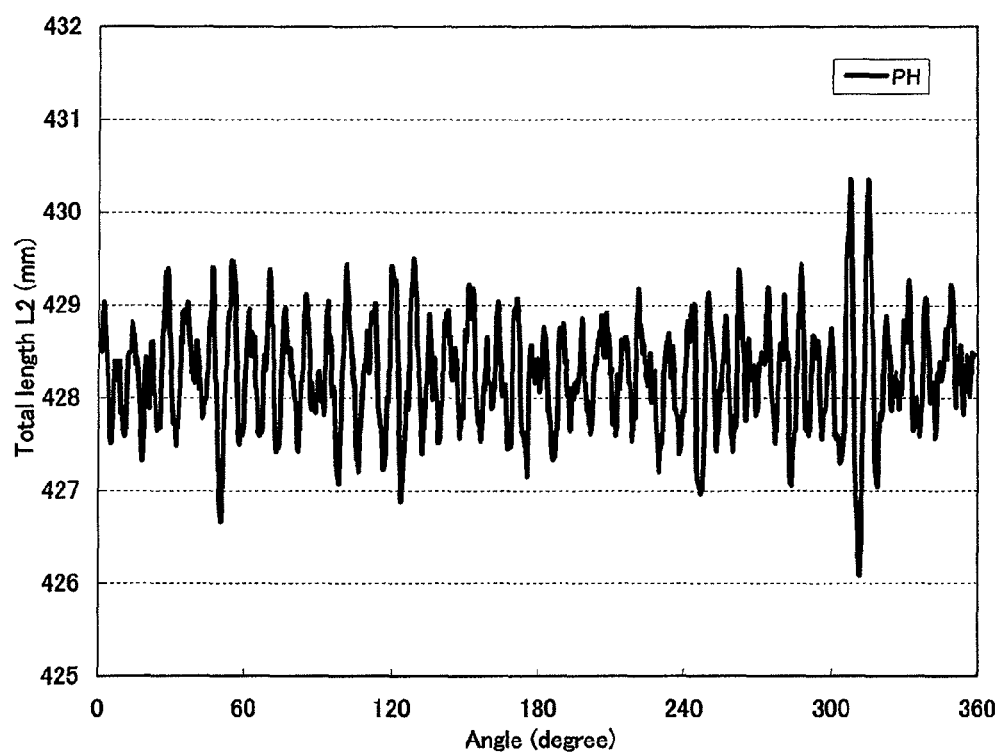
FIG. 37 is a graph showing an evaluation result of the golf ball in FIG. 21.
Figure 38:
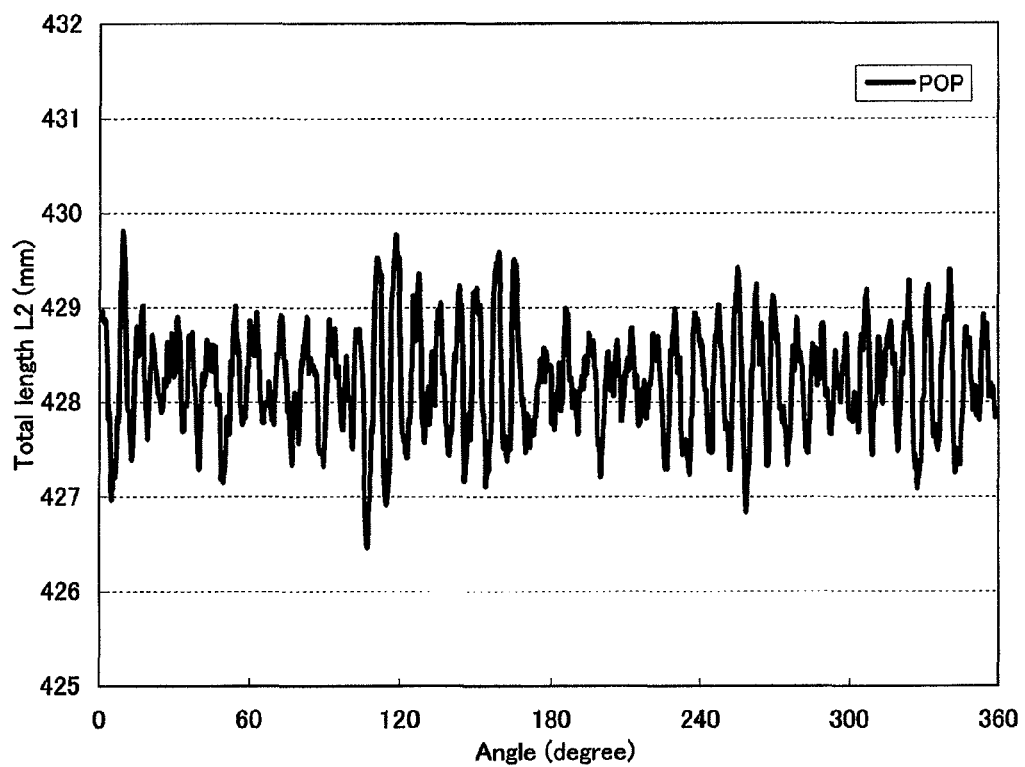
FIG. 38 is a graph showing another evaluation result of the golf ball in FIG. 21.
Figure 39:
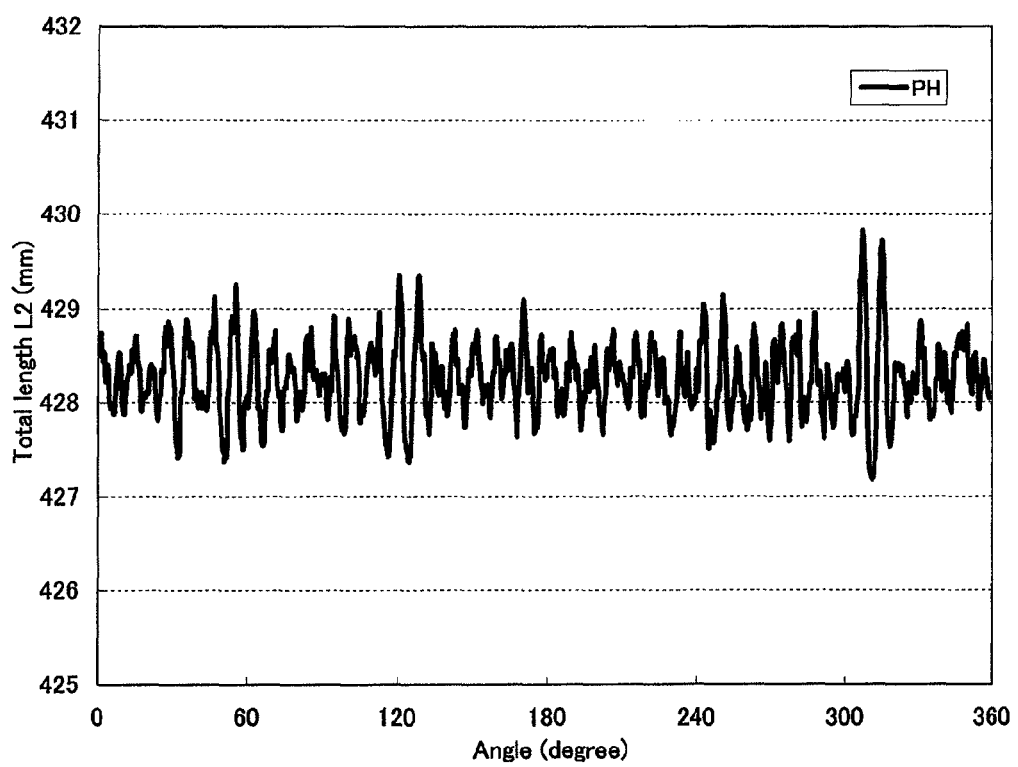
FIG. 39 is a graph showing an evaluation result of the golf ball in FIG. 22.
Figure 40:
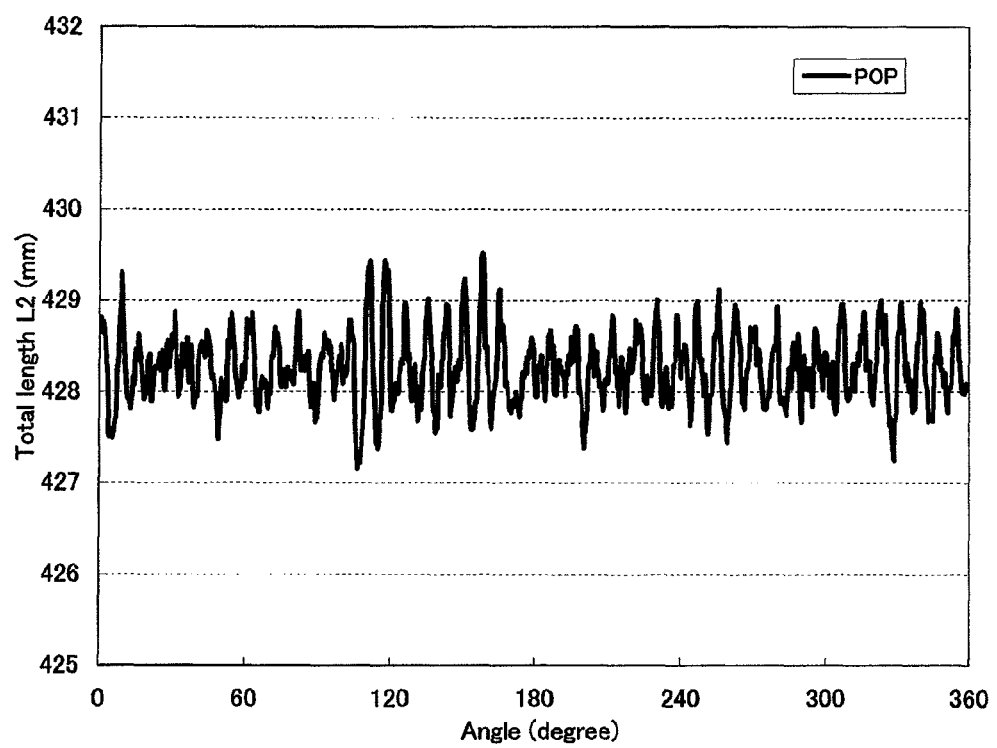
FIG. 40 is a graph showing another evaluation result of the golf ball in FIG. 22.
Figure 41:
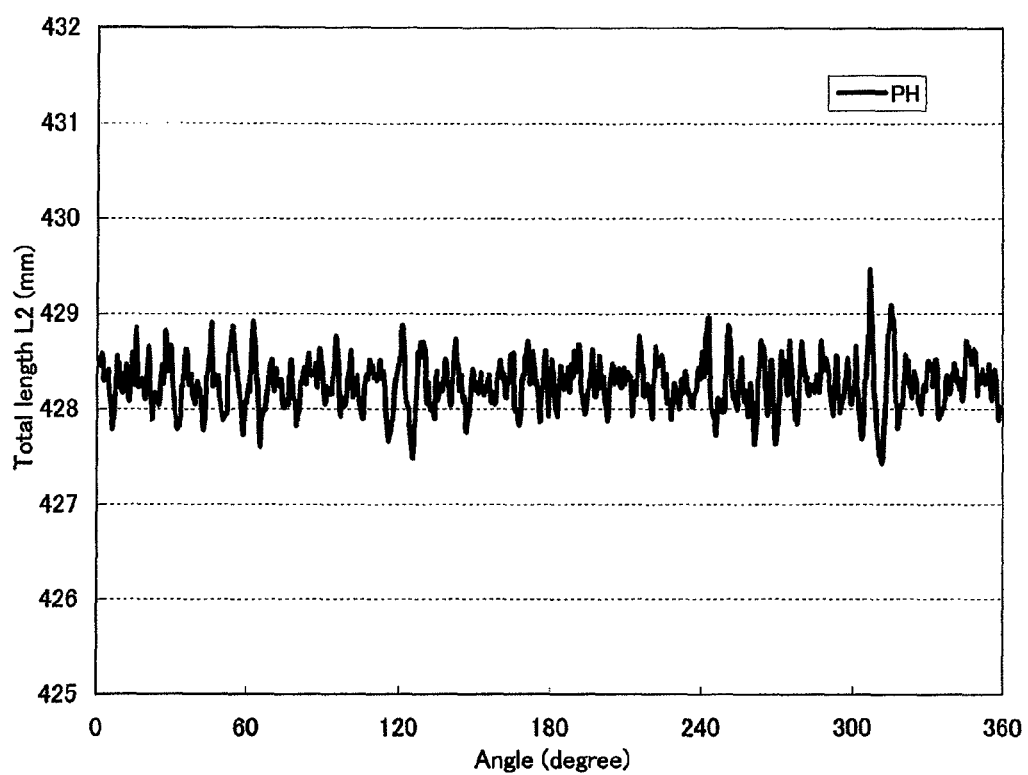
FIG. 41 is a graph showing an evaluation result of the golf ball in FIG. 23.
Figure 42:
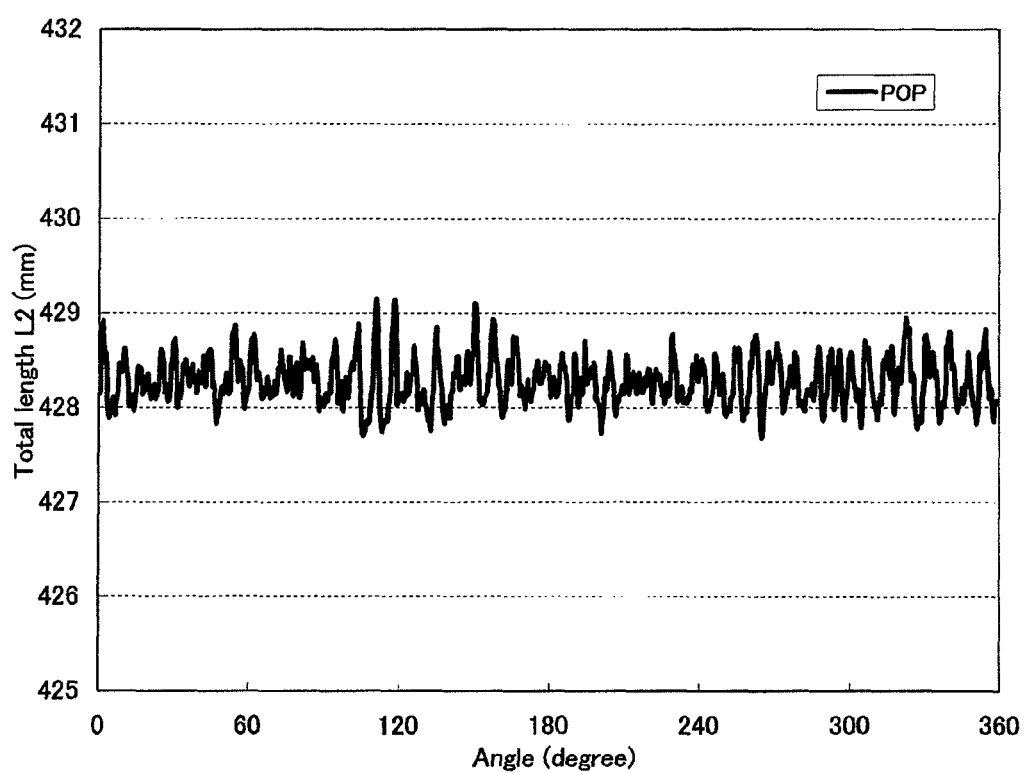
FIG. 42 is a graph showing another evaluation result of the golf ball in FIG. 23.
Figure 43:
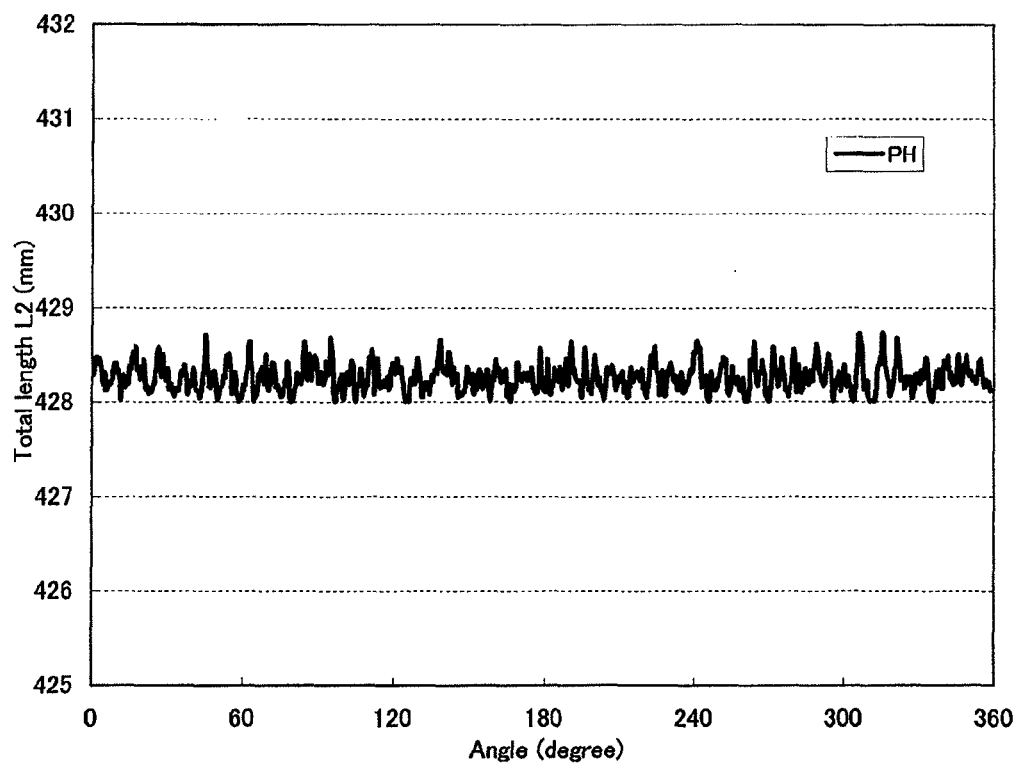
FIG. 43 is a graph showing an evaluation result of the golf ball in FIG. 24.
Figure 44:
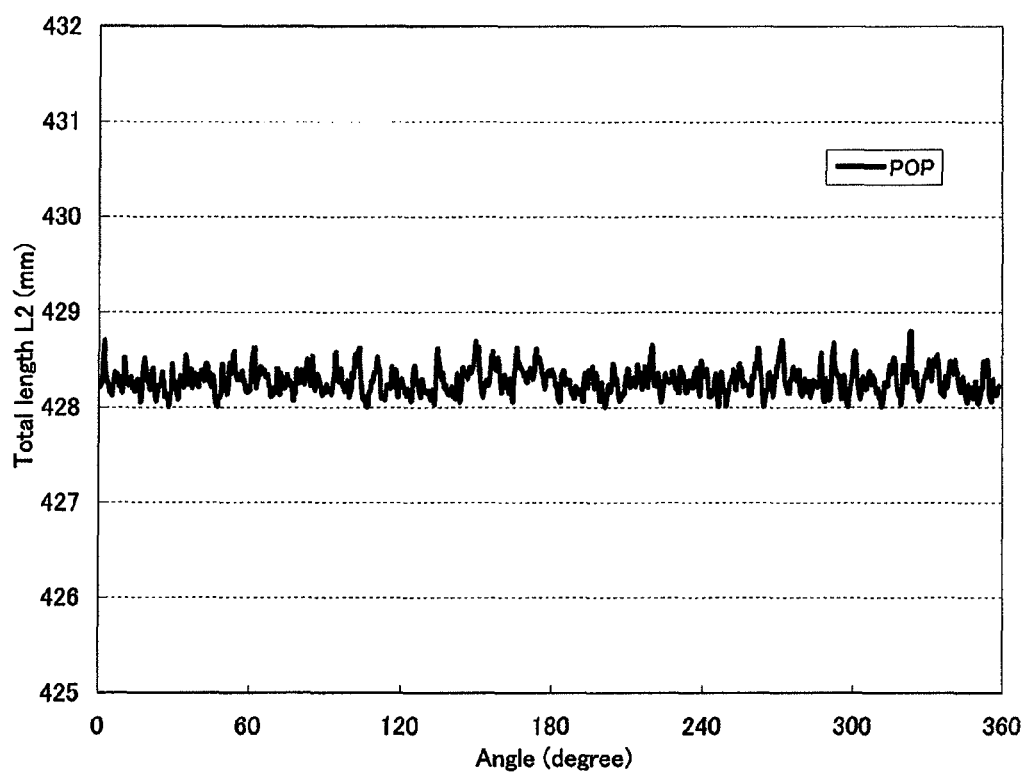
FIG. 44 is a graph showing another evaluation result of the golf ball in FIG. 24.

|  |  | Compara. Example 3 | Example 4 | Example 5 | Example 6 |
|---|---|---|---|---|---|
| Number of cells |  | 157045 | 157045 | 157045 | 157045 |
| Number of times of attribute update n |  | 0 | 1 | 2 | 3 |
| Phase |  | First phase | Second phase | Third phase | Fourth phase |
| Pattern |  | FIG. 21 | FIG. 22 | FIG. 23 | FIG. 24 |
| Occupation ratio (%) |  | 44 | 61 | 80 | 96 |
| Depth (mm) |  | 0.2597 | 0.1814 | 0.1350 | 0.1058 |
| Total volume (mm$^3$) |  | 550 | 550 | 550 | 550 |
| PH rotation | Graph | FIG. 37 | FIG. 39 | FIG. 41 | FIG. 43 |
|  | L2 Maximum | 430.35 | 429.83 | 429.46 | 428.74 |
|  | L2 Minimum | 426.10 | 427.18 | 427.44 | 428.01 |
|  | L2 Average | 428.25 | 428.26 | 428.27 | 428.26 |
|  | Rh | 4.25 | 2.65 | 2.02 | 0.73 |
| POP rotation | Graph | FIG. 38 | FIG. 40 | FIG. 42 | FIG. 44 |
|  | L2 Maximum | 429.82 | 429.52 | 429.15 | 428.80 |
|  | L2 Minimum | 426.47 | 427.15 | 427.68 | 428.01 |
|  | L2 Average | 428.22 | 428.26 | 428.28 | 428.28 |
|  | Ro | 3.35 | 2.37 | 1.47 | 0.79 |
| Absolute value of dR |  | 0.90 | 0.28 | 0.55 | 0.06 |

TABLE 3

Results of Evaluation

Figure 25:
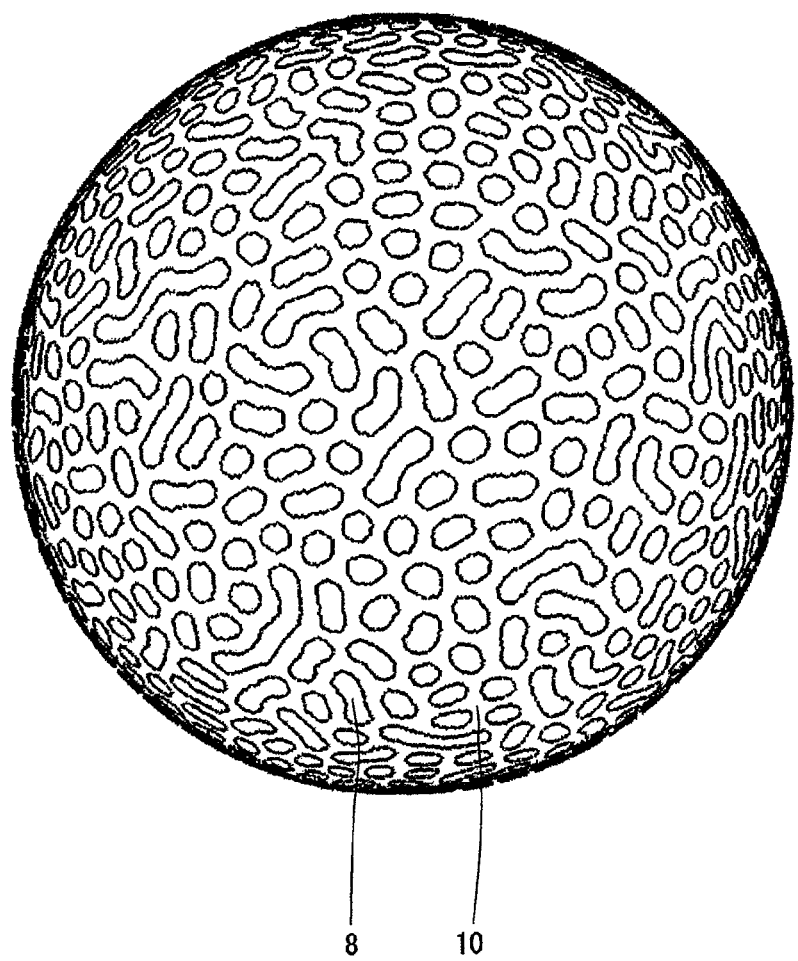
FIG. 25 is a front view of a golf ball according to Comparative Example 4.
Figure 27:
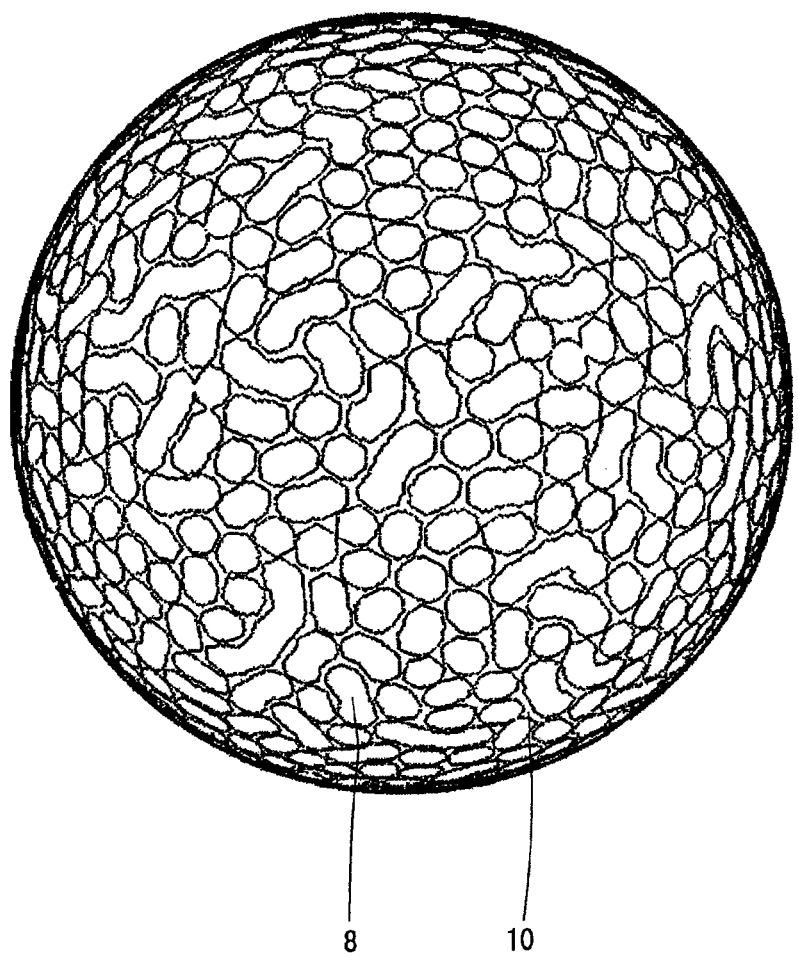
FIG. 27 is a front view of a golf ball according to Example 8.
Figure 28:
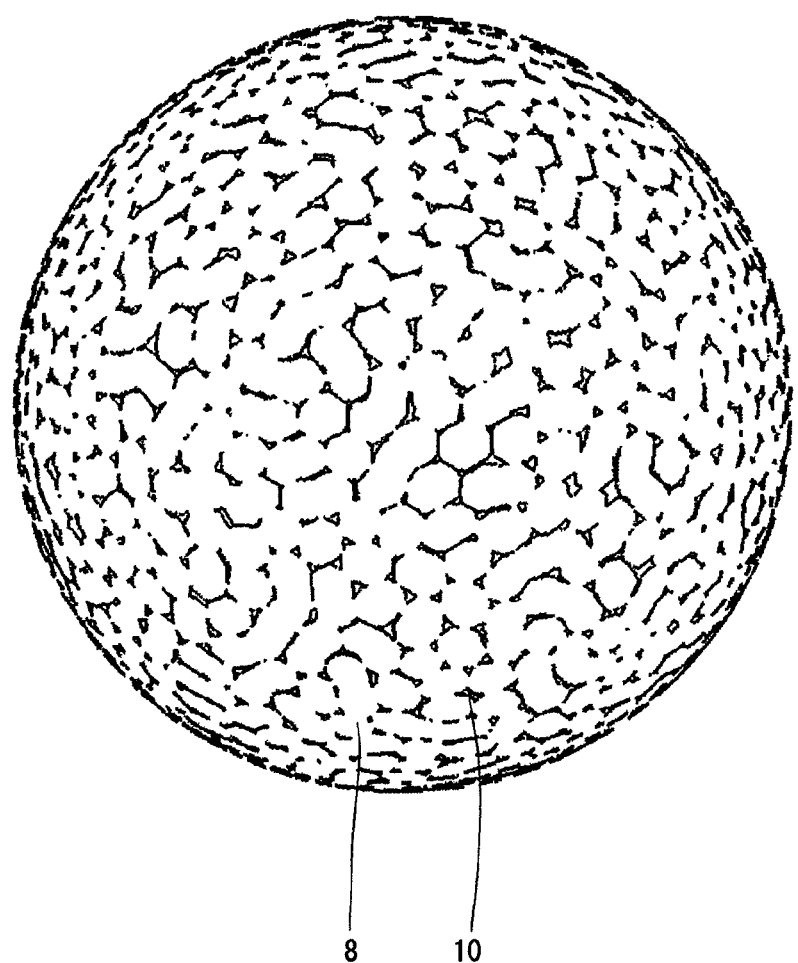
FIG. 28 is a front view of a golf ball according to Example 9.
Figure 45:
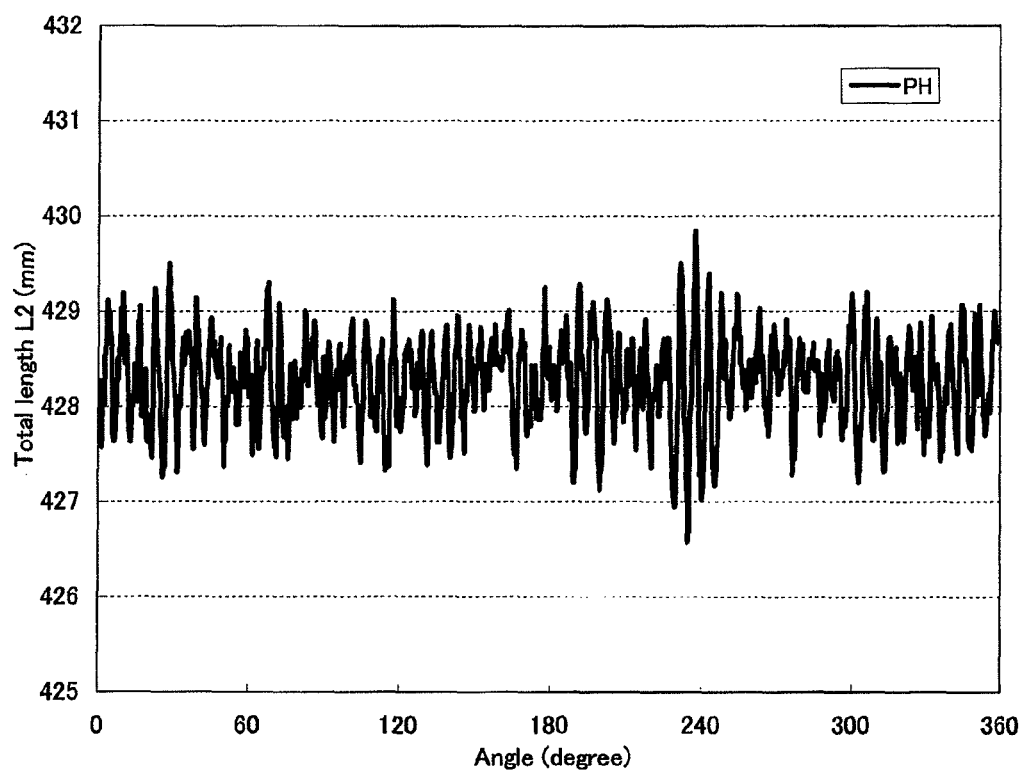
FIG. 45 is a graph showing an evaluation result of the golf ball in FIG. 25.
Figure 46:
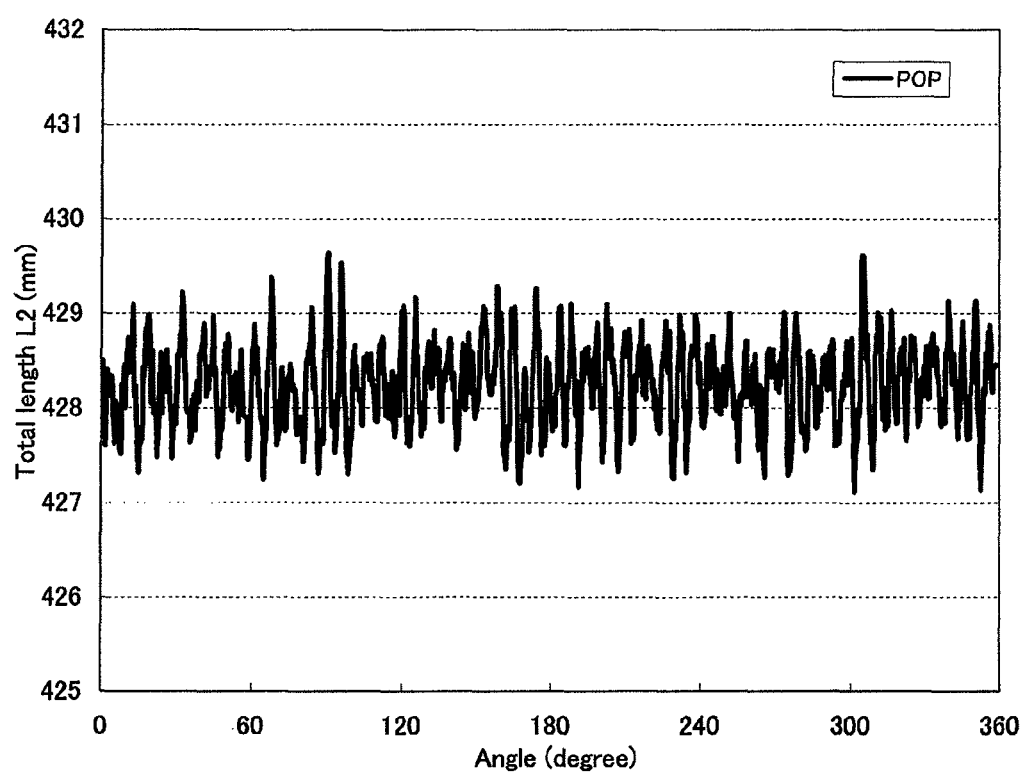
FIG. 46 is a graph showing another evaluation result of the golf ball in FIG. 25.
Figure 47:
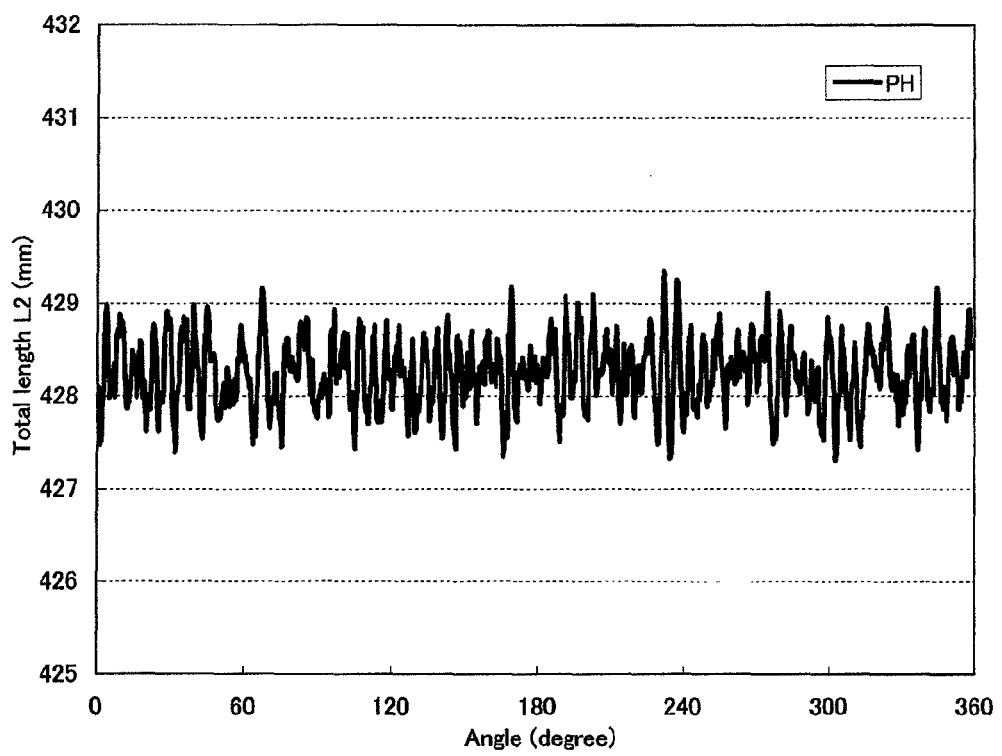
FIG. 47 is a graph showing an evaluation result of the golf ball in FIG. 26.
Figure 48:
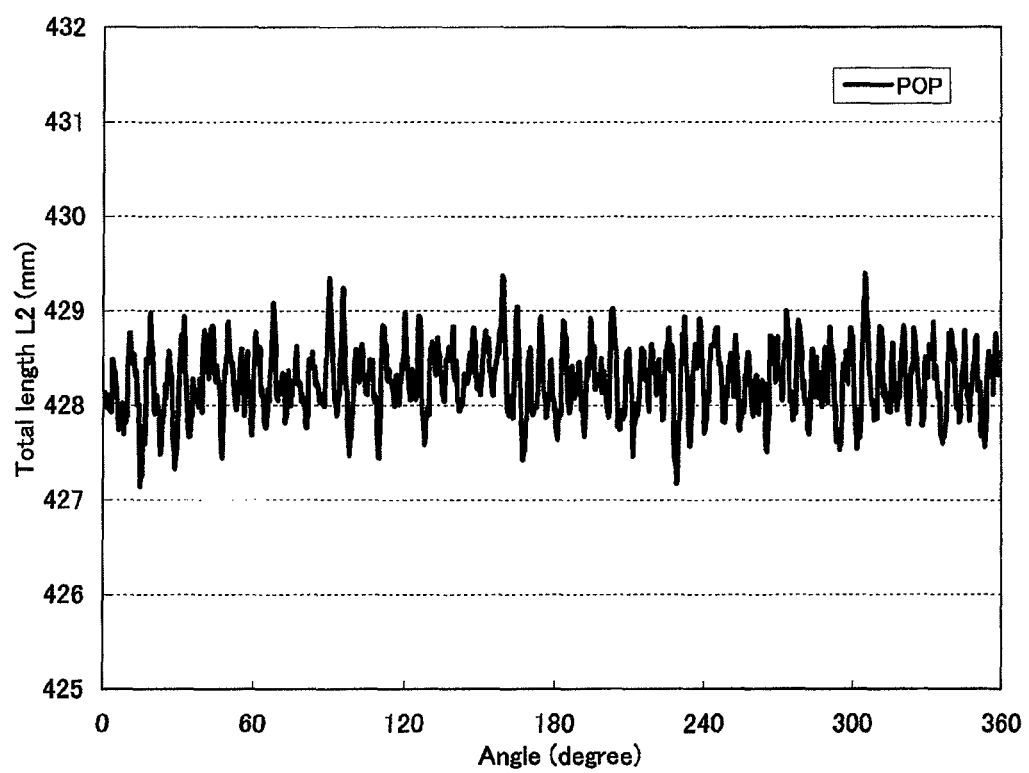
FIG. 48 is a graph showing another evaluation result of the golf ball in FIG. 26.
Figure 49:
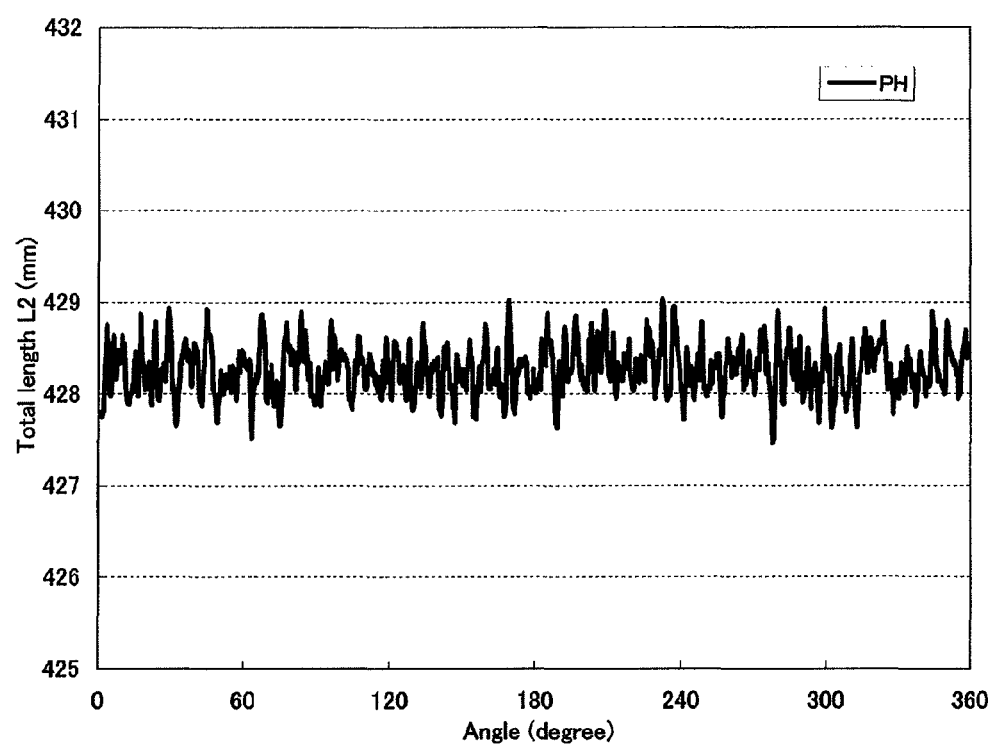
FIG. 49 is a graph showing an evaluation result of the golf ball in FIG. 27.
Figure 50:
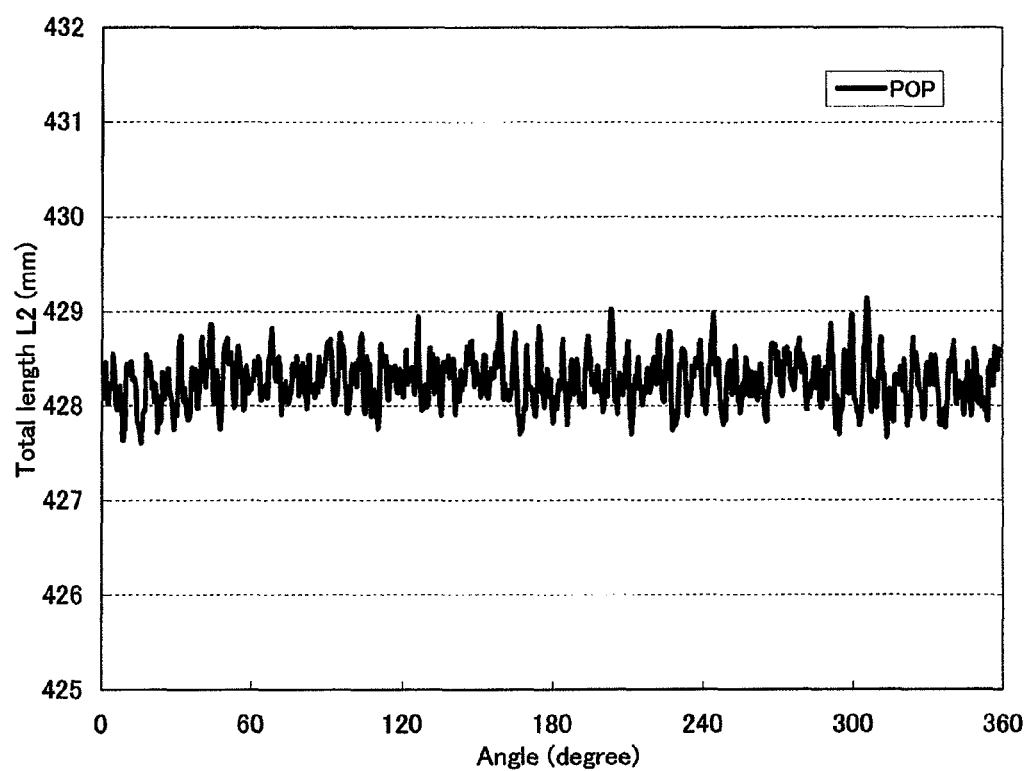
FIG. 50 is a graph showing another evaluation result of the golf ball in FIG. 27.
Figure 51:
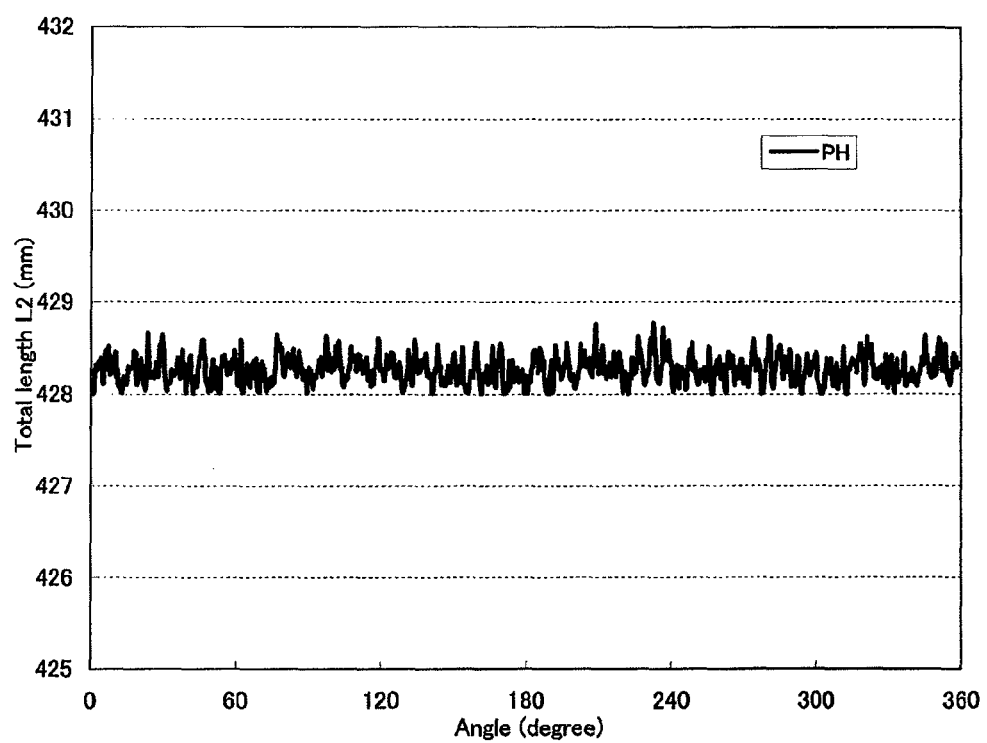
FIG. 51 is a graph showing an evaluation result of the golf ball in FIG. 28.
Figure 52:
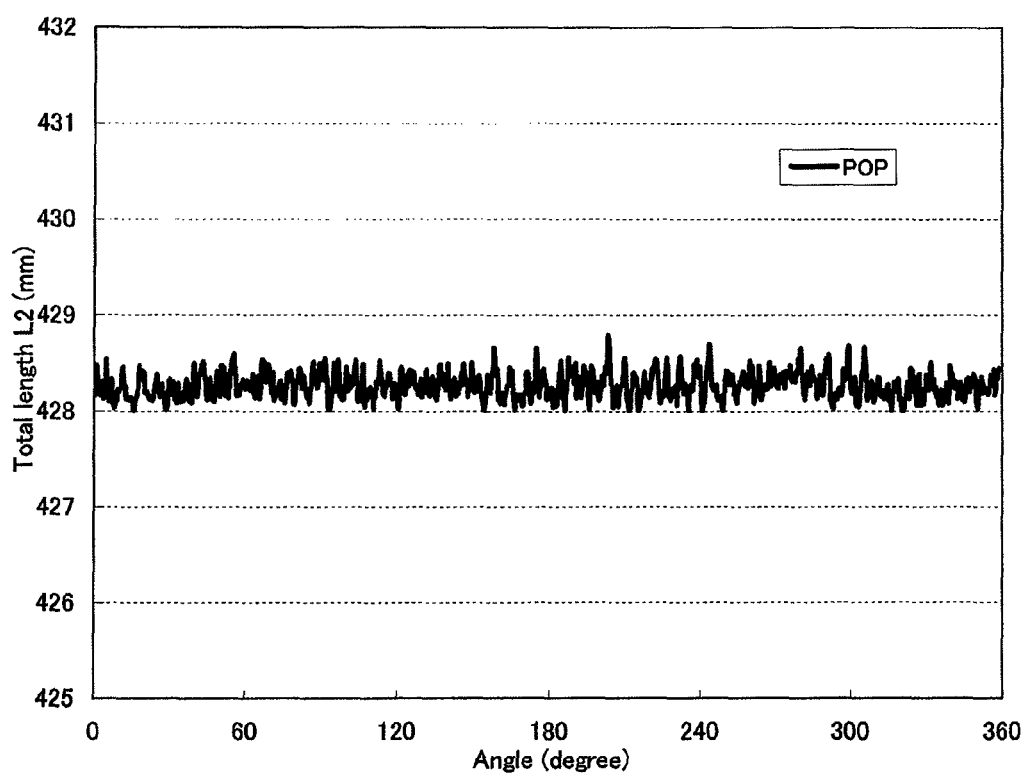
FIG. 52 is a graph showing another evaluation result of the golf ball in FIG. 28.

|  |  | Compara. Example 4 | Example 7 | Example 8 | Example 9 |
|---|---|---|---|---|---|
| Number of cells |  | 279329 | 279329 | 279329 | 279329 |
| Number of times of attribute update n |  | 0 | 1 | 2 | 3 |
| Phase |  | First phase | Second phase | Third phase | Fourth phase |
| Pattern |  | FIG. 25 | FIG. 26 | FIG. 27 | FIG. 28 |
| Occupation ratio (%) |  | 44 | 61 | 80 | 96 |
| Depth (mm) |  | 0.2594 | 0.1814 | 0.1351 | 0.1060 |
| Total volume (mm$^3$) |  | 550 | 550 | 550 | 550 |
| PH rotation | Graph | FIG. 45 | FIG. 47 | FIG. 49 | FIG. 51 |
|  | L2 Maximum | 429.85 | 429.35 | 429.04 | 428.77 |
|  | L2 Minimum | 426.58 | 427.31 | 427.47 | 428.01 |
|  | L2 Average | 428.27 | 428.25 | 428.27 | 428.27 |
|  | Rh | 3.27 | 2.04 | 1.57 | 0.76 |
| POP rotation | Graph | FIG. 46 | FIG. 48 | FIG. 50 | FIG. 52 |
|  | L2 Maximum | 429.64 | 429.39 | 429.14 | 428.80 |
|  | L2 Minimum | 427.12 | 427.14 | 427.61 | 428.01 |
|  | L2 Average | 428.25 | 428.26 | 428.27 | 428.27 |
|  | Ro | 2.52 | 2.25 | 1.53 | 0.79 |
| Absolute value of dR |  | 0.75 | 0.21 | 0.04 | 0.03 |

As shown in Tables 1 to 3, Rh and Ro of each Example are small. In addition, the absolute value of the difference dR of each Example is smaller than that of Comparative Example 2. From the results of evaluation, advantages of the present invention are clear.

The rugged pattern described above is applicable to a one-piece golf ball, a multi-piece golf ball and a thread-wound golf ball, in addition to a two-piece golf ball. The above description is merely for illustrative examples, and various modifications can be made without departing from the principles of the present invention.

What is claimed is:

1. A process for making a rugged pattern on a surface of a golf ball, the process comprising the steps of:

providing a phantom sphere corresponding to the golf ball, a diameter of the phantom sphere being the same as that of the golf ball;

dividing a surface of the phantom sphere into a large number of cells;

determining a plurality of states;

assigning any one of the plurality of states to each cell, wherein assigning the plurality of states includes determining, using a computer processor, whether or not to change a state of each cell based on a value E calculated by the following mathematical formula: $E = W_1 * N_{R1} + W_2 * N_{R1-R2}$, wherein in the mathematical formula, $W_1$ denotes a first concentration, Nm denotes the number of cells that are included in a first circle, not located at the center of the first circle and in a specific state, $W_2$ denotes a second concentration, $N_{R1-R2}$ denotes the number of cells that are included in a second circle, not included in the first circle and in a specific state, the first concentration is positive, the second concentration is negative, the first circle has the center at said each cell and an index radius of $R_1$, the second circle has a center at said each cell and an index radius of $R_2$, and the radius $R_2$ is greater than the radius $R_1$;

assigning, as an attribute, any one of INSIDE, OUTSIDE and BOUNDARY to said each cell based on the state of said each cell and states of a plurality of cells located adjacent to said each cell;

determining craters based on the attributes of the large number of cells;

updating the attribute of said each cell so as to enlarge the areas of the craters, based on the attribute of said each cell and the attributes of the plurality of cells located adjacent to said each cell; and forming craters on the surface of the golf ball conforming to the enlarged craters on the surface of the phantom sphere to form the rugged pattern.

2. The process according to claim 1, wherein:

the crater determining step includes the steps of:

assigning a recess to cells whose attributes are INSIDE or BOUNDARY; and assigning a land to cells whose attributes are OUTSIDE, wherein the crater is determined by a set of recesses.

3. The process according to claim 1, wherein:

the crater determining step includes the steps of:

assigning a recess to cells whose attributes are INSIDE; and assigning a land to cells whose attributes are OUTSIDE or BOUNDARY, wherein the crater is determined by a set of recesses.

4. The process according to claim 1, further comprising the step of calculating the areas of the craters and determining whether or not to perform the update of attribute.

5. The process according to claim 1, wherein the update of attribute is repeated a plurality of times.

6. The process according to claim 1, wherein the attributes of cells whose attributes are OUTSIDE and that are adjacent to cells whose attributes are BOUNDARY are changed to BOUNDARY at the step of updating the attribute of said each cell.

7. The process according to claim 1, wherein:

the assignment of a state to said each cell is performed by the steps of:

deciding an initial state of said each cell;

determining whether or not to change the state of said each cell based on the states of the plurality of cells located adjacent to said each cell; and updating the state of said each cell based on this determination.

8. The process according to claim 7, wherein the initial state is decided in a random manner.

9. The process according to claim 7, wherein the determination as to whether or not to change the state of said each cell and the update of the state of said each cell are repeated 3 times or more.

10. The process according to claim 7, wherein the determination as to whether or not to change the state of said each cell and the update of the state of said each cell are performed by a Cellular Automaton method.

11. The process according to claim 10, wherein the determination as to whether or not to change the state of said each cell and the update of the state of said each cell are performed by a reaction-diffusion model of the Cellular Automaton method.

12. The process according to claim 7, wherein the number of the cells is 5000 or greater and 300000 or less.

13. The process according to claim 1, wherein:

the initial state of said each cell is differentiated or undifferentiated;

when the value E calculated by the following mathematical formula (1) is positive, the state of said each cell is maintained if the state of said each cell is differentiated, and is changed to be differentiated if the state of said each cell is undifferentiated;

when the value E is zero, the state of said each cell is maintained; and when the value E is negative, the state of said each cell is changed to be undifferentiated if the state of said each cell is differentiated, and is maintained if the state of said each cell is undifferentiated, $$E = W_1 * N_{R1} + W_2 * N_{R1\text{-}R2} \quad (1),$$

wherein in the mathematical formula (1), $W_1$ denotes a first concentration, $N_{R1}$ denotes the number of differentiated cells that are included in a first circle and not located at the center of the first circle, $W_2$ denotes a second concentration, $N_{R1\text{-}R2}$ denotes the number of differentiated cells that are included in a second circle and not included in the first circle, the first concentration is positive, the second concentration is negative, the first circle has the center at said each cell and an index radius of $R_1$, the second circle has a center at said each cell and an index radius of $R_2$, and the radius $R_2$ is greater than the radius $R_1$.

14. The process according to claim 1, wherein the first concentration $W_1$ is 0.80 or greater and 1.20 or less.

15. The process according to claim 1, wherein the second concentration $W_2$ is −0.70 or greater and −0.50 or less.

16. The process according to claim 1, wherein the index radius $R_1$ is 2.20 or greater and 5.0 or less.

17. The process according to claim 1, wherein the index radius $R_2$ is 3.0 or greater and 10.0 or less.

* * * * *